United States Patent
Chen et al.

(10) Patent No.: US 9,553,423 B2
(45) Date of Patent: Jan. 24, 2017

(54) MINIATURE STRUCTURED LIGHT ILLUMINATOR

(71) Applicant: Princeton Optronics Inc., Mercerville, NJ (US)

(72) Inventors: Tong Chen, Belle Mead, NJ (US); Chuni L Ghosh, West Windsor, NJ (US); Jean-Francois Seurin, Princeton Junction, NJ (US); Laurence S Watkins, Pennington, NJ (US)

(73) Assignee: PRINCETON OPTRONICS INC., Mercerville, NJ (US)

( * ) Notice: Subject to any disclaimer, the term of this patent is extended or adjusted under 35 U.S.C. 154(b) by 0 days.

(21) Appl. No.: 15/055,589

(22) Filed: Feb. 27, 2016

(65) Prior Publication Data
US 2016/0254638 A1    Sep. 1, 2016

Related U.S. Application Data

(63) Continuation-in-part of application No. 14/848,791, filed on Sep. 9, 2015.
(Continued)

(51) Int. Cl.
  *G03B 15/02*    (2006.01)
  *H01S 5/00*    (2006.01)
(Continued)

(52) U.S. Cl.
  CPC ............. *H01S 5/005* (2013.01); *H01S 5/423* (2013.01); *H04N 13/0203* (2013.01);
(Continued)

(58) Field of Classification Search
  CPC ...... H01S 5/0028; H01S 5/0267; H01S 5/005; H01S 5/42; H01S 5/423; H01S 5/06821; H01S 5/18355; H01S 5/1838
  See application file for complete search history.

(56) References Cited

U.S. PATENT DOCUMENTS 5,325,386 A  *  6/1994  Jewell ............... G02B 27/017
                                                    372/45.01
6,798,438 B2     9/2004  Beier et al.
(Continued)

FOREIGN PATENT DOCUMENTS

CN        103309137 A    9/2013
WO      2004010710 A3    1/2004
(Continued)

OTHER PUBLICATIONS

Thomas Knodle et al; Mutlistage Bipolar Cascade Vertical Cavity Surface Emitting Lasers: Theory and Experiment; Sep./Oct. 2003; IEEE Journal of Selected Topics in Quantum Electronics, vol. 9 No. 5.*

*Primary Examiner* — Anh Mai
*Assistant Examiner* — Matthew Peerce

(57) ABSTRACT

A miniature structured light illuminator is provided. The miniature structured light illuminator uses a semiconductor surface emitting array including VCSEL or RC-LED array and an array of microlens elements to generate a wide range of structured light illumination patterns. The emission beam from a surface emitter array may be selectively directed, steered, focused or expanded, by applying a lateral displacement of the microlens array, such that centers of the emission beam and microlens array are misaligned. Emitted beams may be directed through small optical components to project the structured light pattern to a distant plane. The surface emitting arrays may be configured in addressable form to be activated separately for continuous or pulsed operation with very fast pulses having <100 ps risetime. A compact structured light illuminator module with projection (Continued)

optics is provided in very small physical size ($\sim 6\times 6\times 3$ mm$^3$) suitable to configure in a handheld device.

21 Claims, 16 Drawing Sheets

Related U.S. Application Data

(60) Provisional application No. 62/121,567, filed on Feb. 27, 2015.

(51) Int. Cl.
| | |
|---|---|
| *H01S 5/42* | (2006.01) |
| *H04N 13/02* | (2006.01) |
| *H01S 5/022* | (2006.01) |
| *H01S 5/026* | (2006.01) |
| *H01S 5/183* | (2006.01) |
| *H01S 5/20* | (2006.01) |

(52) U.S. Cl.
CPC ......... *H04N 13/0296* (2013.01); *H01S 5/026* (2013.01); *H01S 5/02276* (2013.01); *H01S 5/18308* (2013.01); *H01S 5/18311* (2013.01); *H01S 5/2063* (2013.01); *H01S 5/2072* (2013.01)

(56) References Cited

U.S. PATENT DOCUMENTS

| | | | |
|---|---|---|---|
| 6,875,993 | B2 | 4/2005 | Tatum et al. |
| 7,160,749 | B2 | 1/2007 | Chua et al. |
| 7,777,173 | B2 | 8/2010 | Price et al. |
| 8,247,252 | B2 | 8/2012 | Gauggel et al. |
| 8,264,536 | B2 | 9/2012 | McEldowney |
| 8,320,621 | B2 | 11/2012 | McEldowney |
| 8,592,739 | B2 | 11/2013 | McEldowney et al. |
| 8,654,152 | B2 | 2/2014 | McEldowney et al. |
| 8,670,029 | B2 | 3/2014 | McEldowney |
| 8,723,118 | B2 | 5/2014 | McEldowney et al. |
| 8,749,796 | B2 | 6/2014 | Pesach et al. |
| 9,048,633 | B2 | 6/2015 | Gronenborn et al. |
| 9,052,086 | B2 * | 6/2015 | Broughton ............... F21V 5/04 |
| 2006/0227844 | A1 * | 10/2006 | Guenter ............. H01S 5/18388 372/101 |
| 2011/0243178 | A1 | 10/2011 | Kolb et al. |
| 2012/0281293 | A1 | 11/2012 | Gronenborn et al. |
| 2012/0293625 | A1 | 11/2012 | Schneider et al. |
| 2012/0300024 | A1 | 11/2012 | McEldowney |
| 2012/0300040 | A1 | 11/2012 | McEldowney |
| 2012/0307075 | A1 | 12/2012 | Margalit |
| 2013/0034117 | A1 * | 2/2013 | Hibbs-Brenner ... H01S 5/34326 372/45.01 |
| 2013/0044187 | A1 * | 2/2013 | Hammes ............. H04N 5/2256 348/46 |
| 2013/0266326 | A1 * | 10/2013 | Joseph ................. H01S 5/183 398/130 |
| 2014/0211215 | A1 | 7/2014 | Pesach et al. |
| 2014/0291520 | A1 | 10/2014 | McEldowney et al. |
| 2014/0375789 | A1 | 12/2014 | Lou et al. |
| 2014/0375790 | A1 | 12/2014 | Robbins et al. |
| 2015/0092258 | A1 | 4/2015 | Herschbach et al. |
| 2015/0097947 | A1 | 4/2015 | Hudman et al. |
| 2015/0108371 | A1 | 4/2015 | Gronenborn et al. |
| 2015/0130932 | A1 | 5/2015 | Vredenborg et al. |
| 2015/0316368 | A1 * | 11/2015 | Moench ................ H01S 5/005 348/46 |

FOREIGN PATENT DOCUMENTS

| | | |
|---|---|---|
| WO | 2005036211 A2 | 4/2005 |
| WO | 2007060666 A1 | 5/2007 |
| WO | 2009153446 A2 | 12/2009 |
| WO | 2011021140 A3 | 2/2011 |
| WO | 2013014563 A1 | 1/2013 |
| WO | 2013127974 A1 | 9/2013 |
| WO | 2013127975 A1 | 9/2013 |
| WO | 2014083485 A1 | 6/2014 |
| WO | 2014203110 A1 | 12/2014 |

* cited by examiner

MINIATURE STRUCTURED LIGHT ILLUMINATOR

CROSS REFERENCE TO RELATED APPLICATION

The present application seeks priority from the United States Provisional Patent Application No. 62/121,567 filed on Feb. 27, 2015, and is a continuation in part (CIP) of the U.S. patent application Ser. No. 14/848,791 filed by Seurin et al. on Sep. 9, 2015, which is a non-provisional application claiming priority from the U.S. Provisional Patent Application No. 62/048,351 by Seurin et al. filed on Sep. 10, 2014, the contents of which applications are being incorporated by reference in its entirety.

BACKGROUND OF THE INVENTION

Field of Invention

The present invention relates to optical modules for light projection and in particular, to a miniature optical light source and module for generating passive and dynamic structured light patterns using arrays, including addressable arrays of surface emitting light sources such as, VCSELs and/or RC-LEDs for applications such as, handheld devices for three dimensional (3-D) imaging, gesture recognition and other applications where compact illumination sources are required.

Background Art

Structured illumination is emerging as an important method for 3-D imaging of a objects in a scene (synonymously a scene hereinafter) in applications that vary from surveillance, gesture recognition, video gaming, Computer Aided Manufacturing (CAM), printing, shop-floor safety, etc., just to name a few. Structured illumination results in unique illumination patterns projected in different regions of the scene and a 3-D image of the scene is obtained by one of several methods known in the art. Most commonly used methods for 3-D imaging are triangulation, time of flight, stereoscopic imaging and often a suitable combination of these methods to get more accurate depth information for the 3-D image. It is therefore important that a device is capable of imaging in more than one way.

In structured light illumination a region of interest or a scene, is illuminated with pattern(s) having specific periodic or random features (microstructure hereinafter) and an image of the scene is obtained. Depending upon the distance of the scene or objects in the scene (from the structured light illumination source) the microstructure is distorted in a recorded image of the scene. A composite image may be generated by overlapping the recorded images to perform suitable analysis in relation to the projected structured illumination to estimate distance/depth information of the objects in the region. In triangulation or time of flight imaging methods, a camera is placed off axis to record the composite image of the structured illumination pattern reflected off of different objects in the scene. This basic methodology is adapted in many other 3-D imaging apparatus known in the art. In stereoscopic imaging at least two cameras are used to view the object using structured light illumination and the three dimensional aspect is generated by proper algorithms in much the same way as a pair of human eyes create a three dimensional visual effect.

In general, structured illumination apparatus comprises three parts—a light source, a pattern generator that generates a structured illumination pattern, and a projection apparatus which may include a single, or a combination of different optical elements for example, refractive or reflective elements (simple or a compound lens, one or more reflector, etc.). The light source includes one or more light emitters for example, a semiconductor light emitter such as, an edge-emitting Light Emitting Diode (LED), surface emitting LED or Resonant Cavity LED (RC-LED) or Vertical Cavity Surface Emitting Laser (VCSEL) that may be configured in arrays to achieve higher illumination intensity. The pattern generator may be an opaque pattern mask, or a more complex mask, such as a diffractive optical element (DOE), a hologram, or a combination of these methods known in the art. Often times, the projection apparatus includes the structured illumination pattern generator.

Use of a separate pattern generator such as a mask or DOE, results in significant light loss affecting brightness and resolution of the structured illumination pattern, particularly at the edges of the illuminated area. In another approach structured illumination patterns are generated and projected by translating, scanning or sweeping a VCSEL array source and the reflected light from an object is tracked synchronously with the translator or scanner device. However, scanning apparatus may limit the speed of imaging, may not be easily portable, and also may be less cost effective for volume applications.

In a different approach an array of semiconductor surface emitting source, such as surface emitting LEDs or RC-LEDs or VCSELs is used as a light source as well as repetitive or a random structured light pattern generator. Devices using an array of light sources are described in the United States Patent Application Publication No. 2013/0044187 by Hammes et al. published on Feb. 21, 2013, and United States Patent Application Publication No. 2012/0293625 by Schneider et al. published on Nov. 22, 2012, where a very large number of individually addressable VCSELs are used to generate random structured illumination patterns.

In a different approach described in the International Patent Application Publication No. WO 2014/083485 by Moench et al., published on Jun. 5, 2014, emission from several laser arrays, each one comprising an irregular distribution of emission areas are superimposed to project a desired pattern on a plane. In another approach disclosed in the U.S. Pat. No. 9,048,633 issued to Grönenborn on Jun. 2, 2015, and United States Patent Application Publication No. 2015/0108371 by Grönenborn et al. published on Apr. 23, 2015, a desired intensity distribution on a working plane is generated by VCSEL devices having differently shaped apertures to project alternate beam shapes.

One limitation of using an array of conventional surface emitting LEDs, RC-LEDs and VCSELs are the low emission power. As disclosed in the United States Patent Application Publication No. 2013/0044187 by Hammes et al. published on Feb. 21, 2013, a large number of devices are needed in an array to generate sufficient optical power. Furthermore, the resolution of the structured light pattern is limited by the pitch (distance between the adjacent devices) of the light emitter array, which in turn impacts the accuracy of depth information in 3-D measurement. For example, the smallest size of the typical state of the art LED or VCSEL device is 5 µm and the minimum spacing of devices in an array is about 15 µm, and more typically about 25 µm. Thus about 100,000 VCSEL devices may be accommodated in a 5×5 mm chip.

Structured light illumination may be generated in regular or irregular shapes and may include regular or irregular patterns. Moreover, different structured light patterns may be generated using the same apparatus. Some prior art methods include uniform illumination as well as structured light pattern illumination options in the same apparatus by using a switchable filter. Different projection methods, either using one step or two steps to cover a larger area or to reach a larger distance (from the light source) are known in the art to avoid image distortion due to diffraction and lens aberrations. Different prior art methods of structured light pattern generation and corresponding detection, are summarized in the 'Background Art' section of the U.S. patent application Ser. No. 14/848,791 filed by Seurin et al. on Sep. 9, 2015, the parent of this application. That description is being incorporated by reference herein.

The U.S. patent application Ser. No. 14/848,791 filed by Seurin et al. on Sep. 9, 2015, also discloses surface emitting sources that generate structured light illumination patterns including different microstructures as well as shapes in the same apparatus. That description is being incorporated by reference herein. More advanced VCSEL devices and arrays, and particularly those that have all electrical contacts are on one surface (top or bottom) of the device is a key to make them very compatible with electronics surface mount assembly technology and also highly suitable for high volume production processes. Examples of surface mountable VCSEL array are described in the U.S. Pat. No. 8,675,706 issued to Seurin et al. on Mar. 18, 2014, and in the United States Patent Application Publication No. 2013/0163627 by Seurin et al. published on Jun. 27, 2013, both co-owned by Princeton Optronics Inc. Mercerville, N.J., the Assignee of this application as well. Contents of the above mentioned patent and publication are being incorporated by reference in its entirety.

Another advancement in VCSEL design using three reflectors allows to increases the resonant cavity length enabling operation in a low order mode at higher power is described in the U.S. Pat. No. 9,268,012 issued to Ghosh et al. on Feb. 23, 2016, co-owned by Princeton Optronics Inc. Mercerville, N.J., the Assignee of this application as well. Three reflector VCSELs has other advantages of the surface mountable design disclosed in the U.S. Pat. No. 8,675,706 and are equally suited for constructing high power structured light illumination source. A further advancement in VCSEL design to obtain high power and brightness is disclosed in the U.S. patent application Ser. No. 14/700,010 by Wang et al. filed on Apr. 29, 2015, includes a gain region with multiple gain segments to boost output power. While the design may be adapted for a conventional two reflector VCSEL, best results are achieved in a three reflector VCSEL. Advantageously, the advanced VCSEL design disclosed therein also operates in a single and preferably linear polarization mode.

Additional optical elements such as microlens array are known to improve brightness and collimation of RC-LED and VCSEL array output beams. A microlens array may be placed externally at the focal distance or near the focal distance from the VCSEL elements. In general, each microlens array element is registered and aligned with the output beam axis of a corresponding VCSEL array to produce an array of coaxial collimated beams. The microlenses reduce the divergence of the beams and propagate highly directional beams to produce an array of high intensity spots that can be used as a structured illumination pattern in the region of interest. Use of microlens array to image the VCSEL aperture on to a distant plane to generate a desired intensity profile is described in the U.S. Pat. No. 9,048,633 issued to Grönenborn on Jun. 2, 2015. A desired intensity profile is generated by configuring an array of VCSEL arrays, each array including VCSELs with differently shaped apertures. In the United States Patent Application Publication No. 2015/0108371 by Grönenborn et al. published on Apr. 23, 2015, to a desired intensity distribution on a working plane is generated by allowing the microlens to be positioned offset from the center of the emission area.

There are several methods for fabricating and assembling the microlens array with the VCSEL or RC-LED array. A separate microlens array can be aligned and bonded in front of the VCSEL array as described in the U.S. Pat. No. 8,675,706 by Seurin et al. issued on Mar. 18, 2014, and the U.S. Pat. No. 9,268,012 issued to Ghosh et al. on Feb. 23, 2016. Alternatively, a microlens array may be constructed aligned with each element of the VCSEL (or RC-LED) array in an integrated fashion, particularly for an array where laser beam exits from the substrate as disclosed in the U.S. Pat. No. 6,888,871 issued to Zhang et al. on May 3, 2005. Contents of all the above mentioned patents, co-owned by Princeton Optronics Inc. Mercerville, N.J., also the Assignee of this application, are being incorporated by reference in entirety.

While the above mentioned methods to incorporate microlens array with the VCSEL array work well for relatively large illumination assemblies they have limitations when designing a miniature illuminator for handheld compact devices for 3-D imaging, gesture recognition, tablets, smart phones and laptop computers where the illuminator assembly is accommodated within a few millimeter thickness of the portable devices. Small apertures of imaging lens or microlens would block some of the emission from the VCSELs.

In this invention a miniature structured light illuminator and an illuminator module is provided using surface emitting light sources constructed to have different microstructure that may be used either alone or superimposed to generate different structured light patterns. Furthermore, surface emitting light source array is integrated with a microlens array designed to allow majority of the emission beam to be directed through small optical components and projected into a region of interest with minimum loss of intensity and distortion to the optimum structured illumination pattern. By suitably selecting a microlens array design to include different types of microlens, a wide range of convergent or divergent structured illumination pattern of different shapes and sizes may be generated to suit different applications within the general principles of this invention.

SUMMARY OF THE INVENTION

In one aspect of the invention an optical module to generate a structured light illumination pattern is provided. Different structured light illumination patterns are generated using a surface emitting light source and in particular array of such light source. The array of surface emitting light sources is integrated with an array of microlens to generate structured light illumination patterns in different sizes and shapes. The emission pattern is imaged/projected using projection optics. In one embodiment, very compact optical module is provided to facilitate incorporating these modules in handheld devices for applications such as 3-D imaging, gesture recognition, or predictive menu selection in laptop computer, smart phones, tablets etc.

In one aspect of the invention, microlens array is designed to deflect the emission beam from the surface emitting light source in a desired direction to a desired extent by laterally displacing the microlens center away from the center of the emission beam by a predetermined amount, such that there is a limited misalignment. The direction in which the beam is deflected is a function of the curvature of the microlens and for small displacement is linearly proportional to the displacement.

In a different aspect of the invention microlens array may be configured with different combinations of microlens for example, spherical, aspherical, symmetric, asymmetric, concave or convex, so as to deflect different emission beams in different direction to different extent. In general, emission beams may be converged, diverged, or reshaped to generate structured light illumination pattern of different shapes and sizes. In a variant aspect the lateral displacement of the microlens may be progressively varied in reference with their position relative to the center of the surface emitting light source array.

In one aspect of the invention an array of surface emitting light source integrated with an array of microlens is combined with a low profile projection optics in an optical module measuring 6.5 mm×6.5 mm×3 mm. The optical module may be assembled on a flexible or a rigid printed circuit board (PCB) to provide a sub-assembly for a hand-held device. In a different aspect, the optical module may be surface mounted with electronic components on a common PCB (on-board optics) to construct a stand-alone compact device for applications such as 3-D imaging.

In one aspect of the invention, the surface emitting light source is preferably a RC-LED or a VCSEL device as these devices may easily be constructed as monolithic arrays and may be easily integrated with microlens array, whether bonded or constructed monolithically. In a different aspect VCSEL arrays or RC-LED arrays are configured in addressable form to operate sources in different parts of array individually, in groups or sub-arrays, continuously or in pulses with <100 pS rise time.

In another aspect of the invention, high resolution structured light pattern may be generated by including VCSEL with advanced design to provide high power, high brightness and polarization control in surface emitting light source arrays. The advanced design includes three reflector VCSEL devices, multiple gain segments and gratings for polarization control. In another aspect, the microstructure of the structured light pattern may be varied by using current confinement apertures of varied shapes to generate different microstructure in a structured light illumination pattern.

BRIEF DESCRIPTION OF THE DRAWINGS

Different aspects describing a broad framework of the invention are presented in the specification which will be better understood and appreciated in conjunction with the drawing figures in which—

DETAILED DESCRIPTION

A broad framework of the principles will be presented by describing various aspects of this invention using exemplary embodiments that are represented in different drawing figures. For clarity and ease of description, each embodiment includes only a few aspects. However, different aspects from different embodiments may be practiced as shown, or different aspects may be practiced in desired combinations and sub-combinations shown in different drawing figures. Other combinations and sub-combinations of the representative embodiments within the broad framework of this invention, but not explicitly shown or described, including those that may be apparent to those skilled in the art, should not be construed as precluded.

The miniature structured light illuminator as disclosed in this invention may be practiced with any surface emitting semiconductor light source including RC-LED conventional two-reflector VCSEL for low output power, as well as three reflector VCSEL for superior performance (hereinafter surface emitting light source or surface emitting device). RC-LEDs are similar to VCSELs in many aspects such as, both are two terminal devices that are configurable in arrays (hereinafter surface emitting arrays or array chips), either independently addressable, or in groups (sub-arrays) or collectively, ease of wafer level testing and adaptability for surface mounting and volume production. RC-LED and VCSELs are easily adaptable for integration with microlens arrays in more than one way, with or without a lateral offset, to generate structured light illumination patterns, as will be described shortly. However, RC-LEDs are limited in their applications since the emission linewidth is much larger and the output beam numerical aperture is higher. But RC-LEDs due to their short coherence length, and are therefore more suitable for illumination and imaging applications that would require less speckle.

Figure 1:
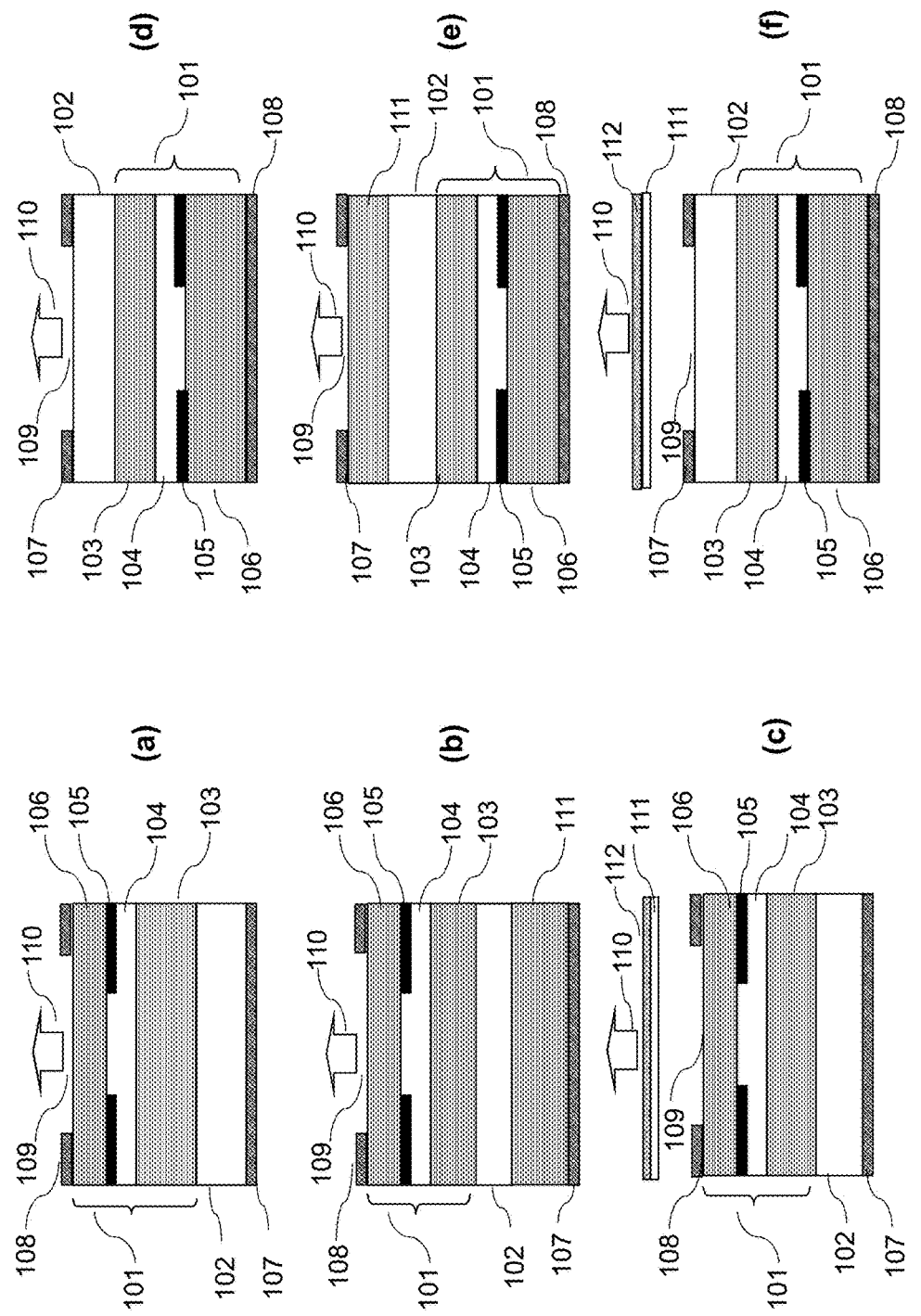
FIG. 1 shows different configurations of a surface emitting light source: a) a top emitting two reflector device, b) a top emitting integrated three reflector VCSEL, c) a top emitting external three reflector VCSEL, d) a bottom emitting two reflector device, e) a bottom emitting integrated three reflector VCSEL, and f) a bottom emitting external three reflector VCSEL.

Referring now to FIG. 1, there it shows a basic structure of a surface emitting light source that may be adaptable for a RC-LED or a VCSEL. In FIGS. 1a-1f, identical elements having similar functions are labeled with same reference numerals and the same description applies, unless stated otherwise. For the ease of description and clarity, only isolated devices are shown here which may appear to be similar to a mesa structure. In an array, where a plurality of devices is constructed on a common substrate each device in an array may be isolated not necessarily by etching a mesa, but also using other options like proton implantation. In fact, a surface emitting array can be constructed with both surfaces quite flat, especially for surface mounting (as described earlier in co-owned patents and patent application publication and patent applications (U.S. Pat. Nos. 8,675, 706, 9,268,012, 2013/0163627, 14/700010 and 14/848791, all assigned to Princeton Optronics Inc., Mercrville, N.J., also the Assignee of this application).

Referring specifically to FIG. 1a, it schematically shows a cross section of a conventional two terminal top-emitting light source where the structure shown collectively as 101 is the light generating section grown epitaxially over a substrate 102 and is located above the substrate (in this view). In a basic surface emitting device, the light generating section comprises two reflectors 103 and 106, often Distributed Bragg Reflectors (DBR) located on either side of a gain region 104. An optional current confinement aperture 105 is located in the gain region to confine current flow inside a pre-determined region to maximize gain in a small volume for optimum output power in a single mode.

The light generating section 101 of devices shown in FIGS. 1a-1c are typical of a top-emitting construction where the DBR 103 (bottom DBR) located proximal to the substrate 102 has a higher reflectivity as compared to the DBR 106 (top DBR) located distal to the substrate end, near the surface with emission window 109. The DBR 106 has a slightly lower reflectivity, such that a small portion 110 is transmitted as output emission through the emission window 109 provided in the top electrical contact 108 by selectively removing/depositing the contact metallization. The other electrical contact 107 is provided by a contiguous metallization to the substrate (common to all devices in an array). Often, prior to metallization the substrate is thinned or almost removed such that the light emitting region is in close proximity to an external heat dissipating/transfer surface.

As a convention, 'top' and 'bottom' end is synonymously used for the light emitting section and the substrate ends of the device, respectively. Accordingly, a bottom emitting device shown in FIG. 1d is flipped upside down (relative to the top emitting device shown in FIG. 1a) such that the substrate 102 is vertically above the light generating section 101 so that emission 110 out of the device is still in the same upward direction as in top-emitting device (FIG. 1a). Notably, for bottom emitting device the emission window 109 is on the substrate. Therefore, the emission window 109 is created by selectively removing/depositing the contact metallization 107 while the metallization 108 on the light emitting section (101) is a contiguous layer (common to all devices in an array).

For the desired device operation in the bottom emitting mode, some adjustments are made to the DBR design; more specifically, the top DBR (106) is designed to have a higher reflectivity as compared to the bottom DBR (103) because light generated in the gain region is transmitted through the bottom DBR (103) and out of the substrate (102). The substrate is thinned or almost removed to prevent emitted radiation from being absorbed in the substrate (depending upon the emission wavelength). Since most heat is generated in the light generating section, this configuration is more preferred for high output power configuration as the device can be mounted with the light generating section in close proximity to the heat dissipation/transfer surface when mounted with substrate side up.

The structures described above is common to RC-LED as well as VCSEL. The difference lies in the design of the DBRs, and in particular the reflectivity of the DBRs 103 and 106 that determines the resonant cavity properties. In the RC-LED the top semiconductor DBR 106 is designed to have a lower reflectivity than that of a VCSEL, such that laser action is not supported. The resonant cavity of RC-LED is designed for a lower Q factor than that of a VCSEL therefore RC-LED does not lase. The resonant cavity in RC-LED acts to narrow the linewidth of the spontaneous emission from the gain region by increasing the loss for light at wavelengths that are not supported in the cavity.

While the current confinement aperture 105 is typically an annular ring, other shapes for current confinement aperture are not precluded. In fact, other shapes of current confinement apertures are used to generate a desired shape and size of an illumination pattern as disclosed in the prior art (U.S. Pat. No. 9,048,633 issued to Grönenborn on Jun. 2, 2015 and United States Patent Application Publication No. 2015/0108371 by Grönenborn et al. published on Apr. 23, 2015). In the U.S. patent application Ser. No. 14/848,791 filed by Seurin et al. on Sep. 9, 2015 (in particular in FIG. 10) it is disclosed that differently shaped current confining apertures are used to generate a desired microstructure for the structured light illumination pattern or/and by selectively overlapping differently shaped emission from the surface emitting sources, or/and by addressing surface emitting sources in different timing sequence, etc. That disclosure is being incorporated by reference in its entirety.

The gain region in a conventional surface emitting device comprises a single gain segment including one or more quantum wells to generate photons by electrically (or optically) pumping the gain region. However, in an advanced design surface emitting devices, gain region may include multiple gain segments to boost output power from the device. Each group of quantum wells has a separate aperture associated with it to confine the current and the optical mode in the same physical volume to obtain high gain and power transfer into the optical mode. Furthermore, tunnel junctions are interposed between each gain segment to facilitate carrier flow between the gain segments. The structure is described in detail in the U.S. patent application Ser. No. 14/700,010 by Wang et al. filed on Apr. 29, 2015, co-owned by Princeton Optronics Inc., Mercerville, N.J., also the Assignee of this application. The content of that application is being incorporated by reference in its entirety.

A basic two reflector surface emitting device (FIGS. 1a and 1d) is suitable for very low output power in low order or single transverse mode. Increasing the drive current to operate the two reflector device at higher power results in multimode operation. While the output power is increased the brightness of the beam is not increased because power is distributed in various modes that may be blocked by the current confining aperture. In order to further increase the power in a single-mode operation and increase the brightness at the same time, the device cavity parameters are changed to increase the mode diameter to draw power from a larger volume of one or more gain segments. Increasing the cavity length increases the diameter of the lasing modes and therefore a larger size aperture can be used to control single-mode operation thus increasing the gain volume to obtain higher power and brightness.

Exemplary embodiments shown in FIGS. 1b, 1c and 1e and 1f, provide alternative three reflector device construction, for example a VCSEL which shows significantly improved performance over RC-LED for the reasons described earlier. More specifically, equivalent top and bottom emitting configurations are represented by embodiments shown in FIGS. 1b and 1c (top emitting) and FIGS. 1e and 1f (bottom emitting), respectively. Referring now to FIG. 1b, the light generating section 101 is similar to the one shown in FIG. 1a except that the reflectivity of the DBR 103 is designed such that the resonant cavity between DBRs 103 and 106 provides gain but does not support lasing. A third reflector 111 (often another DBR) interposed between the substrate (102) and the bottom electrical metallization (107) is designed to have a reflectivity higher than reflectivity of the two DBRs 103 and 106, such that lasing action is supported in the extended cavity set up by the DBRs 111 and 106. The cavity length is extended by the thickness of the substrate 102 in this embodiment.

In an alternative embodiment, DBR 111 comprise a reflective coating deposited on another substrate, preferably a transparent substrate, bonded to the substrate 102. In yet another alternative embodiment (not shown), the substrate 102 may optionally be thinned or almost removed and a third reflector comprising a reflective coating on a transparent substrate is bonded to the rest of the light generating section (101) using a transparent adhesive with an optional spacer in between to position the third reflector to a desired distance. In another alternative shown in FIG. 1c, the third reflector 111 comprising a reflective coating 112 on a transparent substrate is positioned above the emission surface (109). The third reflector may be bonded using a transparent adhesive with an optional spacer in between to position the third reflector to a desired distance. The reflectivity of the third reflector is selected such that laser emission 110 is emitted out from the third reflector. It should be noted that the DBRs has to be carefully designed such that reflectance of the lasing occurs only between the two end reflectors. The embodiments shown in FIGS. 1e and 1f are equivalent bottom emitting configurations corresponding to the top emitting configurations shown in FIGS. 1b and 1c, respectively.

Figure 2:
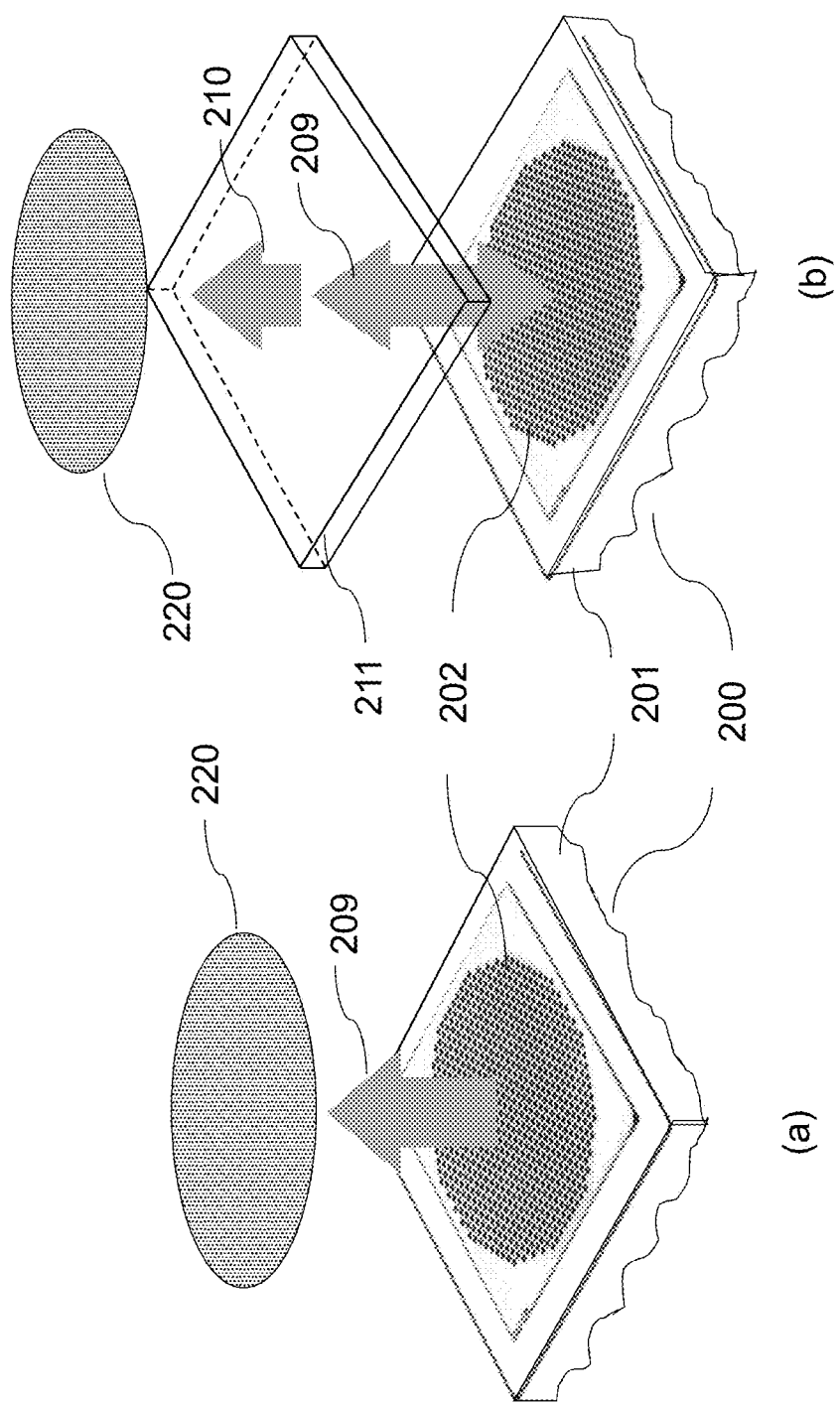
FIG. 2 is a schematic representation of a monolithic array of surface emitting light source devices in an array of, a) two reflector devices or integrated three reflector VCSELs, and b) external three reflector VCSELs.

While a single high power, high brightness VCSEL device may be appropriate for a light source to generate a structured light illumination pattern using an external pattern generator (e.g., DOE) a preferred option is to use a surface emitting array to generate a structured light illumination pattern. FIG. 2 shows an exemplary structured light pattern generator using a monolithic array of surface emitting devices (VCSELs or RC-LEDs). More specifically, FIG. 2a shows an array chip 202 including a plurality of surface emitting devices grown monolithically on a common substrate (not shown). Each dot in the drawing figure represents an individual VCSEL (surface emitting device) of the kind shown in FIGS. 1a and 1b (or 1d and 1e). All the VCSELs in the array chip share a common electrical terminal through the metallization on the common substrate.

The two dimensional circular array pattern shown in FIG. 2a is only representative and should not construed to be limiting. The entire chip is bonded to a thermal submount, a PCB or a heat dissipating surface a 201 as the application may require. Advantageously, by providing access to both the electrical terminals on the same side (top or bottom surface) of the array chip, the VCSEL array chip is readily adaptable for surface mount technology or flip-chip technology to mount the VCSEL chip on a submount or PCB with other electronic components to operate and control the surface emitting source as disclosed in the U.S. Pat. No. 8,675,706 issued on Jun. 27, 2013 and U.S. Pat. No. 8,783,893 issued on Jul. 22, 2014, co-authored by some of the inventors of this application and co-owned by Princeton Optronics Inc. Mercerville, N.J., also the Assignee of this application. Contents of the above mentioned patents are being incorporated by reference in its entirety.

In this exemplary embodiment all the VCSELs in the array chip are connected to a common terminal through the common metallization layer that includes emission windows, to be operated together to generate a structured light pattern 220 comprising of dots. The embodiment shown in FIG. 2b represents another example where the array chip is configured using an external third reflector 211 (as shown in FIGS. 1c and 1f). The structured light pattern is emitted out of the third reflector in this configuration. The shape of the array chip and distribution of VCSELs in the array is a design choice for generating different shapes and patterns for structured light illumination. Furthermore, VCSELs having current confining apertures of different shapes may be included in the array chip such that the structured light pattern has microstructure having different shapes.

In alternate embodiments, each VCSEL or a group of VCSELs may be electrically connected for separate activation, either individually or in groups, sub-arrays that are pre-determined or dynamically addressed. One advantage of having separately addressable arrays is that the resolution of the structured light pattern (determined by the pitch of the array) may be dynamically changed. Both these aspects are disclosed (particular reference to FIGS. 10, 11, 12, 13, 14 and 15) in the U.S. patent application Ser. No. 14/700,010 by Wang et al. filed on Apr. 29, 2015, co-owned by Princeton Optronics Inc., Mercerville, N.J., also the Assignee of this application. Another advantage is that different sections of the structured light pattern may be illuminated at different times or with different resolutions to reduce the complexity of the imaging system and analysis since it does not have to analyze the whole image at the same time. Yet another advantage is that the whole image does not have to be illuminated all the time and specific region of interest may be targeted separately at different times.

These options when incorporated in the miniature structured light illuminator facilitate a faster and more effective analysis of the image. Another aspect of addressing VCSELs individually or in small groups is the advantage of applying very fast driver pulses for a time of flight measurements using a high speed camera or detector array which reduces the complexity of the computation for depth analysis using the structure light images and increases the accuracy and efficiency of the 3-D imaging. Additionally, the power requirement for addressable array is lower as only parts of the array are activated at a given time. Therefore, the structured light sources are more suitable for portable devices that provide quick imaging and analysis of the images.

As mentioned earlier, emission from VCSELs may be collimated further by adding microlens arrays and/or imaging lenses to project a structured light illumination pattern on a distant plane. For a large assembly, an external microlens array may be placed in front of the VCSEL array as described in the U.S. Pat. No. 9,048,633 issued to Grönenborn on Jun. 2, 2015, the United States Patent Application Publication No. 2015/0108371 by Grönenborn et al. published on Apr. 23, 2015, the U.S. Pat. No. 8,675,706 by Seurin et al. issued on Mar. 18, 2014, and the U.S. Pat. No. 9,268,012 issued to Ghosh et al. on Feb. 23, 2016. However, in a miniature structured light illuminator, external microlens array may occupy more physical space and may obstruct part of the emission beam.

Figure 3:
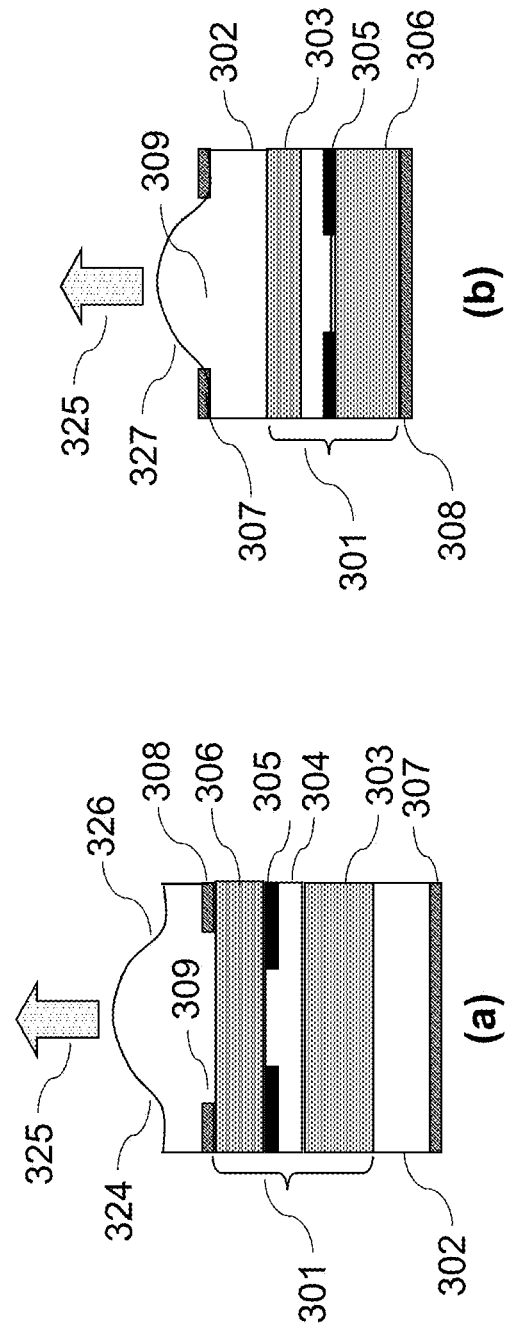
FIG. 3 shows integration of a microlens array fabricated on top of a surface emitting device: a) top emitting configuration and b) bottom emitting configuration.

In one aspect of the invention a miniature microlens array is integrated with the surface emitting VCSEL (or RC-LED) array to achieve a compact structured light illuminator. The microlens assembly may be practiced with VCSEL arrays constructed from any type of VCSELs (shown in FIGS. 1a-1f) although the basic principles will be outlined using a conventional two reflector top and bottom emitting VCSEL (RC-LED) device (FIGS. 1a and 1d, respectively) for ease of description. FIG. 3 shows a microlens integrated with a VCSEL device. The microlens array may be constructed separately and integrated with the VCSEL array by bonding (as disclosed in the U.S. Pat. No. 8,675,706), or may be constructed integrated with the VCSEL devices U.S. Pat. No. 6,888,871), or by another method to be described shortly. Referring simultaneously to FIGS. 1 and 3, the basic device structure shown in FIGS. 1a and 1d corresponding to the top and bottom emitting devices are similar to the basic device structure shown in FIGS. 3a and 3b, respectively, and identical elements in the respective drawing figures are labeled with equivalent reference numerals such that same description applies.

More specifically, the light generating section 301 is equivalent to that of 101 and includes substantially identical components. Description of the basic components of the VCSEL structure will not be repeated for brevity. A transparent optical material 326 is deposited over the emission window and is shaped to form a spherical surface using a method including Reactive Ion Etching, molding or other suitable process to form a convex lens 324. The shape and curvature of the lens is designed to provide a pre-determined focal length to collimate the beam emitted out of the emission window 309 in the top electrical contact region 308. The output beam 325 is emitted out of the convex surface of the microlens. One advantage of constructing the microlens as described here is that the size of the microlens is perfectly matched to the size of the emission region, thereby allowing most of the light emitted out of the VCSEL device to be collimated.

In a bottom emitting VCSEL device shown in FIG. 3b, the microlens is constructed on the substrate surface opposite to the light generating section 301. The lens 327 is constructed using the procedure described in reference to the top emitting VCSEL. Alternatively, the lens is created by etching the substrate by wet etching or by RIE as described in U.S. Pat. No. 6,888,871 issued to Zhang et al. on May 3, 2005, co-owned by Princeton Optronics Inc., Mercerville, N.J., the Assignee of this application as well. Contents of the above mentioned patent is being incorporated by reference in its entirety. The shape and curvature of the lens is designed to provide a pre-determined focal length to collimate the beam emitted out of the emission window 309 in the electrical contact region 307. It should be noted that the process described in reference to individual VCSEL device is equally suited to construct an array of microlenses matching and aligned with each individual VCSEL device of the structured light illuminator.

Figure 4:
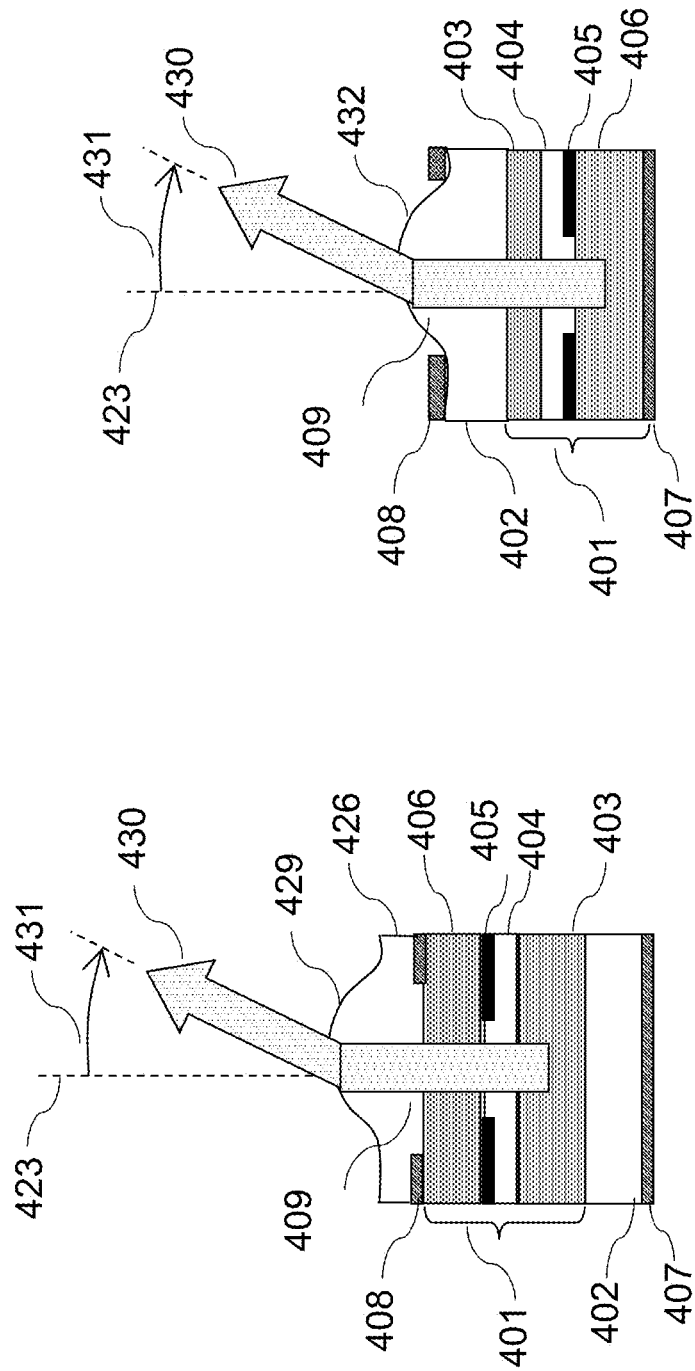
FIG. 4 shows a schematic representation of beam deflection by lateral displacement of an integrated microlens for a, a) top emitting device and b) bottom emitting device.

When using lenses or other optical component, it is important that the diameter of the optical component must be larger than the beam diameter to capture all the radiation from the output beam. At the same time, it is also important to keep the optical component size small particularly, for a miniature structured light illuminator. In one embodiment of this invention the lateral position of the microlens is adjusted to change the direction of the beams emitted from individual surface emitting devices to allow use of a smaller size optical component. One exemplary embodiment is shown in FIG. 4 to illustrate the principle. For ease of description, the concepts are illustrated using a VCSEL device (top and bottom emitting) similar to those shown in FIGS. 3a and 3b (also applicable for RC-LED). The basic structure of the VCSEL device is substantially similar and identical parts are labeled with similar reference numerals. The description associated with each reference numeral in the VCSEL devices shown in FIGS. 3a and 3b applies to the elements labeled similarly.

More specifically, a transparent material 426 is deposited over the emission window (409) and a lens structure 429 is constructed according to the procedure described in reference with FIG. 3a. The microlens 429 is laterally displaced such that the microlens central axis is no longer coincident with the central axis 423 of the emitted beam (or the VCSEL). As a result, the beam is emitted with a tilt in the direction of the displacement. The beam 430 propagates at an angle 431 with reference to the original direction of emission prior to reaching the microlens. The amount of beam deflection 431 is proportional to the lateral displacement of the microlens for small amount of lateral displacement. Therefore, the lateral displacement may be calculated using well know optical principles a priori to direct the beam in a desired direction. However, the proportionality may not exactly be linear for larger amount of displacement. FIG. 4b illustrates the effect for a bottom emitting device where the microlens is constructed on the substrate 402.

Figure 5:
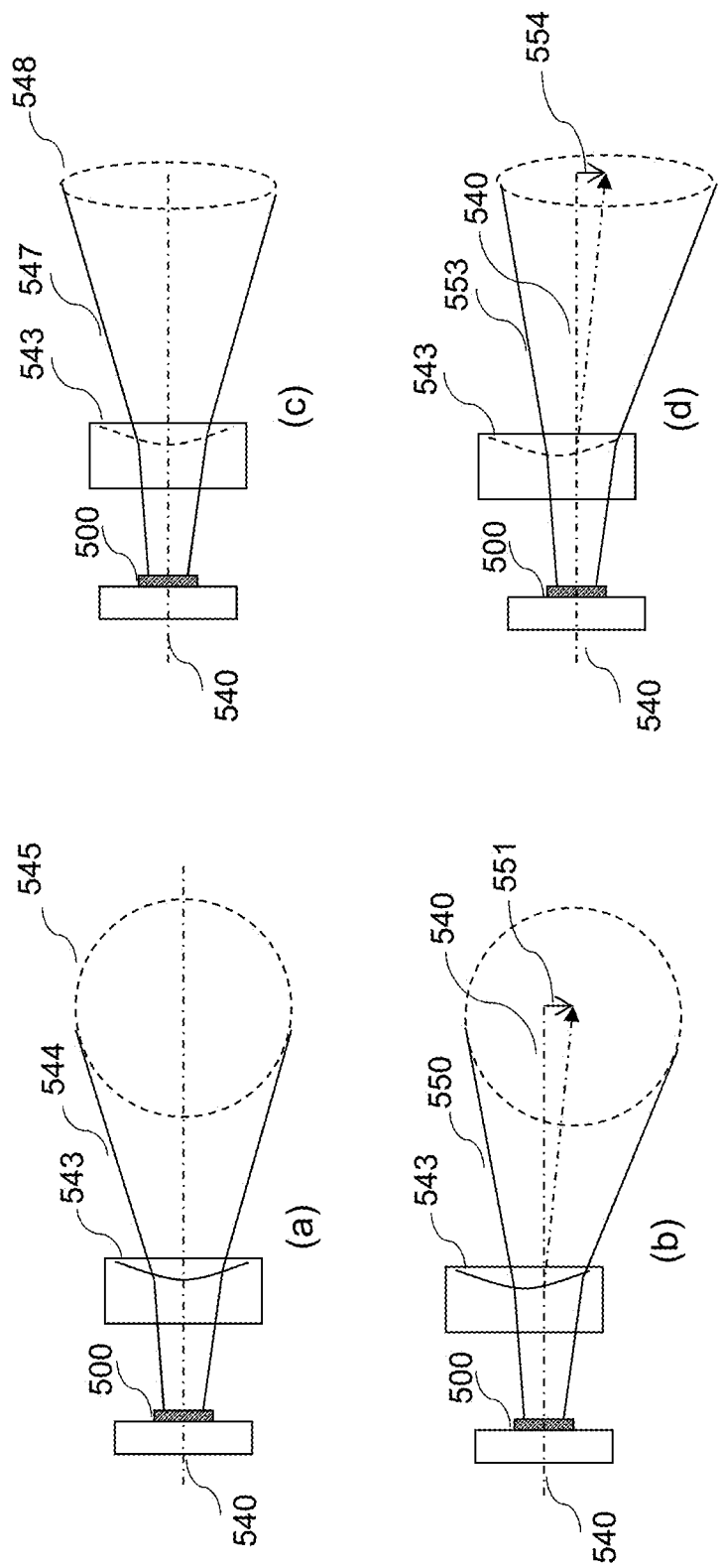
FIG. 5 shows a schematic representation of beam deflection using a concave microlens for a, a) spherical lens positioned without lateral displacement, b) spherical lens positioned with lateral displacement, c) spherical lens positioned without lateral displacement, and d) spherical lens positioned with lateral displacement.

In another embodiment of the invention a concave microlens may be used instead of a convex microlens described earlier for a different effect as will be described shortly. Use of a concave microlens is particularly advantageous to achieve a wide angle structured light illumination pattern. The effect of using a concave microlens is explained in reference with FIG. 5. In particular, FIGS. 5a and 5b depict the effect of translation of a symmetric spherical microlens array to a position that is off-axis from the center axis of the VCSEL array. More specifically, in FIG. 5a, 500 represents a VCSEL or a VCSEL array that emits a beam (to the right in this reference) along the central axis 540 of the VCSEL array (shown as a dashed line). A microlens or a microlens array including concave microlens(es) 543 is positioned aligned centrally with axis (540) of the VCSEL array. The emitted beam has increased divergence 544 thereby producing an expanded image 545 of the structured light pattern at a distal plane. The divergent beam may further be titled by laterally displacing the microlens off-axis (relative to the central axis 540 of the beam or the VCSEL) as shown in FIG. 5*b*. A lateral displacement of the microlens to a new position off-axis to the VCSEL central axis (540) generates a different divergence (550) and an angular tilt 551. For small displacements of the microlens, the tilt is linearly proportional in a direction opposite to the lateral displacement of the microlens.

The same concept is extended to asymmetric optical elements. In another embodiment, shown in FIGS. 5*c* and 5*d*, a cylindrical concave microlens array is used in a configuration similar to the one shown in FIG. 5*a*. More specifically, in FIG. 5*c* a cylindrical concave microlens element 546 is positioned aligned centrally with the axis (540) of the VCSEL array (500). An oval or line shaped beam 548 is generated. The divergence (547) and the width of the image (structured light pattern) depend upon the lens characteristics. By translating the microlens element laterally to a new position off-axis to the VCESL central axis (540) as shown in FIG. 5*d*, the divergence (553) is altered with an angular tilt 554. It can be appreciated that many other combinations of translation and microlens designs may be used to alter the structured light pattern.

Figure 6:
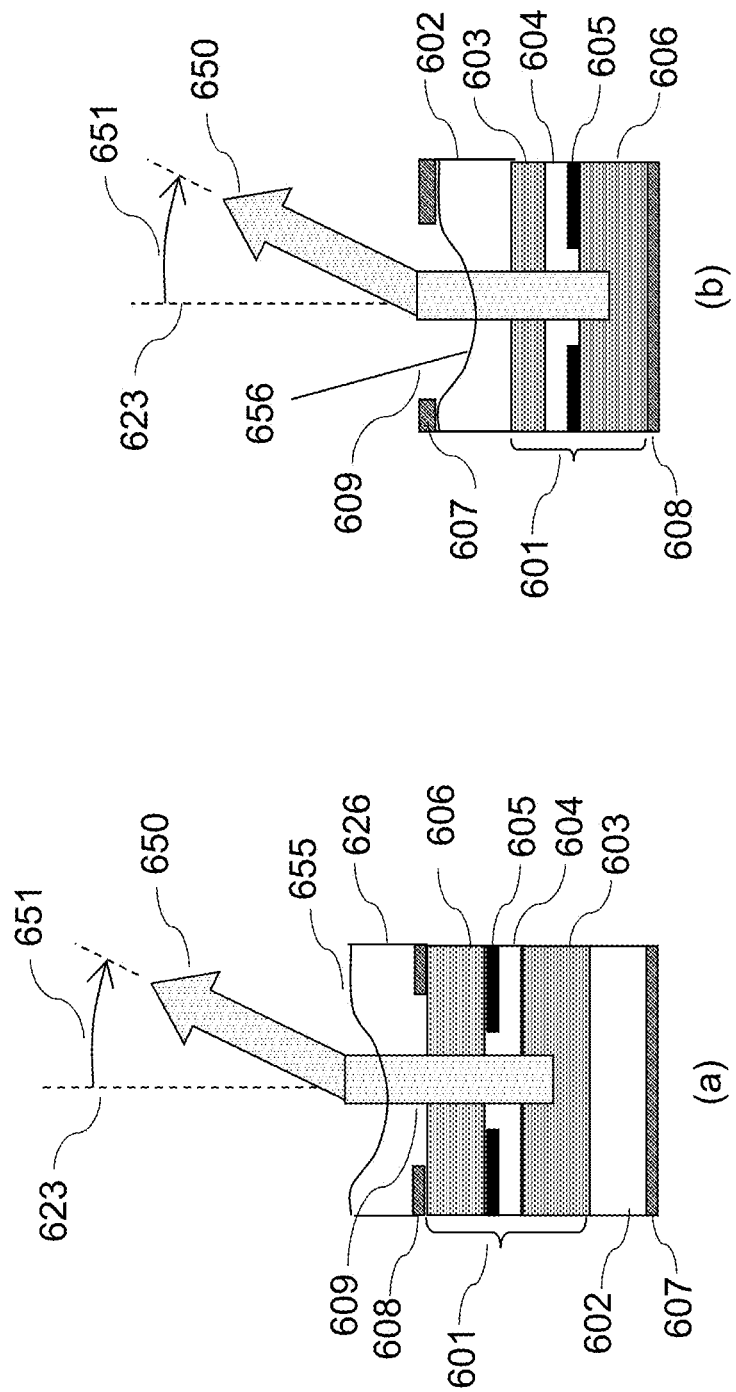
FIG. 6 shows a schematic representation of monolithic integration of a concave microlens with a surface emitting device in: a) top emitting configuration and b) bottom emitting configuration.

Concave microlens array may be configured integrated with the surface emitting array (VCSEL or RC-LED). FIG. 6 shows an example of integration of a concave microlens with a top and bottom emitting VCSEL, respectively in FIGS. 6*a* and 6*b*. The exemplary surface emitting device structure is substantially similar to those shown in FIGS. 4*a* and 4*b* and that description will not be repeated. The microlens is constructed on the emission surface (in both cases) by depositing a transparent optical material 626 and subsequently shaped by RIE etching or other suitable fabrication processes, including molding, to form a concave lens 655. The shape of the lens 655 is designed to provide a desired amount of beam divergence. The lens axis is offset with reference to the emission surface central axis to provide a desired tilt angle 651 to the beam 650 emitted out of the lens surface. The same concept is applicable to a bottom emitting VCSEL device as shown in FIG. 6*b*. The lens may be fabricated on a transparent optical material or by selectively etching the substrate (602) by RIE or wet chemical etching.

For ease of description the concepts in the previous paragraphs were presented in reference to a single device and a single microlens. It should not be construed as limiting. It is not always necessary to include a microlens for each VCSEL device in the array. Often, a microlens is registered with a sub-set of VCSEL devices in the array. For example, a microlens may be designed to serve a sub-array (linear or two-dimensional), or a random group of light emitters. Furthermore, in a microlens array, different types and combinations of symmetrical and a-symmetrical lens such as, cylindrical convex or concave, aspheric curvature lenses, etc. may be used to generate different deflection in different sections of the surface emitting array to generate different structured light patterns. The shapes of current confining apertures of the surface emitting devices are also important in the selection of microlens array.

Furthermore, translation of microlens to generate a desired tilt would provide additional dimension in generation of different shapes of the structured light patterns. For small sized arrays requiring relatively small maximum tilt angles the microlens element displacement is linearly proportional to the distance of the emitting element from the center of the array. For larger arrays or when large maximum tilt angles are needed there is a deviation from this linear proportionality. Therefore, a piecewise linear proportional relationship is used, such that different linear functions are applied for different sections and at different distances from the array center. Some of the concepts are further elaborated using specific examples, next.

Figure 7:
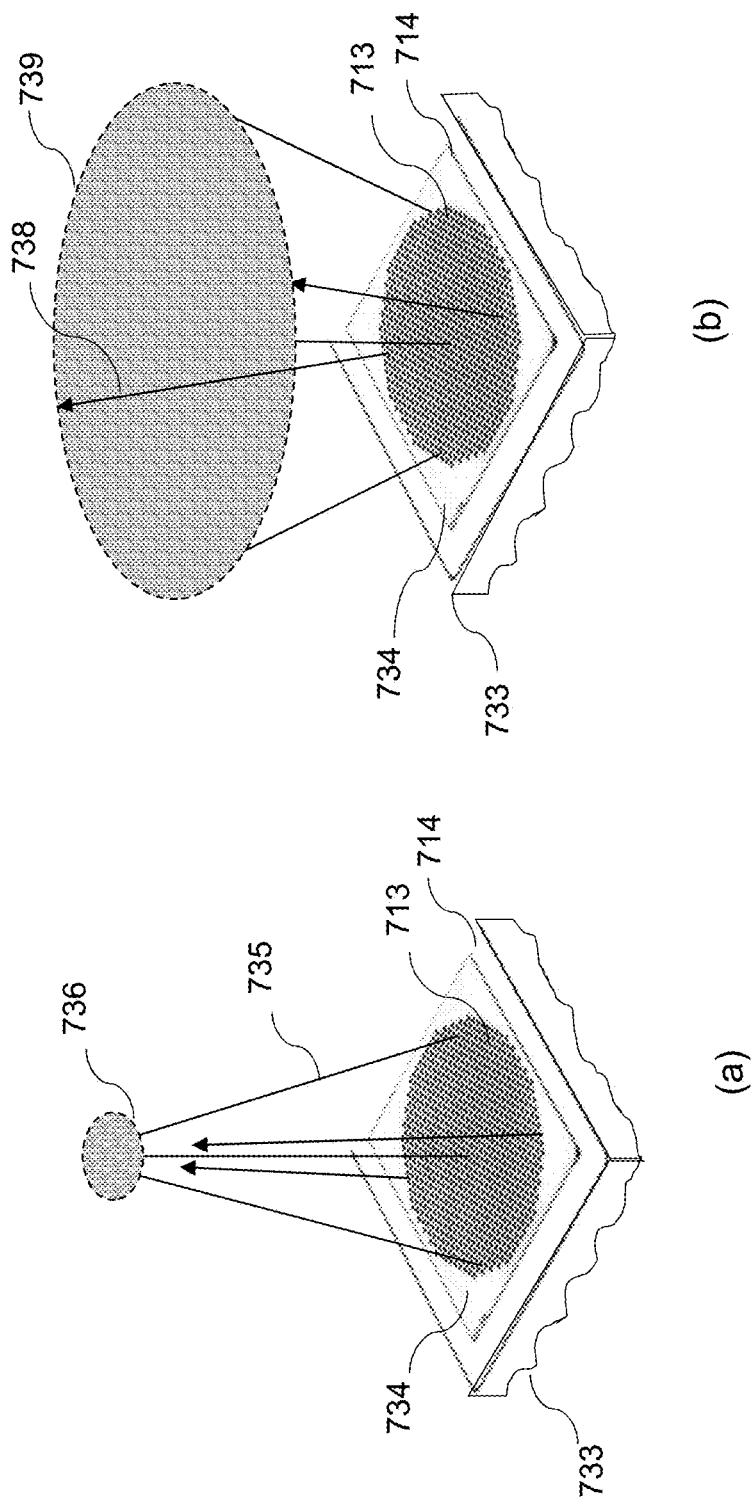
FIG. 7 is a schematic representation of engineering progressive lateral displacements of microlens to: a) focus a structured light illumination pattern and b) to expand a structured light illumination pattern.

In one embodiment of the invention shown in FIG. 7*a*, a structured light illuminator is constructed to include a VCSEL array chip 713, and a microlens array 734. In this particular example, a VCSEL array chip is fabricated on a substrate 714 and the microlens array is positioned and bonded at the focal distance. The entire ensemble is mounted on a heat dissipating thermal submount 733. Furthermore, the microlens arrays located near the center of the array chip is aligned with the central axis of the array chip, whereas the microlens arrays located away from center of the array chip are displaced in a pre-determined direction (depending upon the curvature of the microlens array) to proportionally tilt the corresponding beams by a desired angle towards the center of the array chip (for example 735).

The displacement of the microlens arrays is increased to progressively tilt the emitted beams located further away, to more towards the center of the array chip. The emission generated farther away from the center of the array chip experience a larger tilt and the emission from the VCSEL devices near the periphery of the array chip experience the maximum tilt. The microlens displacements are progressively arranged so that all the beams are directed through a small aperture region 736. It can be appreciated that instead of using a dense array of surface emitting sources, the resolution of the structured light pattern is enhanced optically by focusing the pattern to a smaller diameter. Alternately, a more complex non-linear function such as parabolic, can be used to improve the accuracy of the array beams' deflection so they all are accurately directed to propagate through the same desired location 736.

In a different embodiment shown in FIG. 7*b*, an illumination module is configured to provide structured light illumination over a region 739 that is wider than the array chip 713. The array chip is substantially similar to the one shown in FIG. 7*a*. However, the microlens array 734 is configured differently to provide lateral displacement in the opposite direction to the configuration shown in FIG. 7*a*. More specifically, each microlens array is progressively displaced by a pre-determined extent in a direction (with respect to the center of the array chip) such that the emission beams are tilted outwards (738). The structured light pattern so generated would cover a larger area as compared to the area of the array chip. This option may be applicable in a situation where a larger area is scanned for locating an object in a scene, rather than obtaining an accurate 3-D image, for example.

Figure 8:
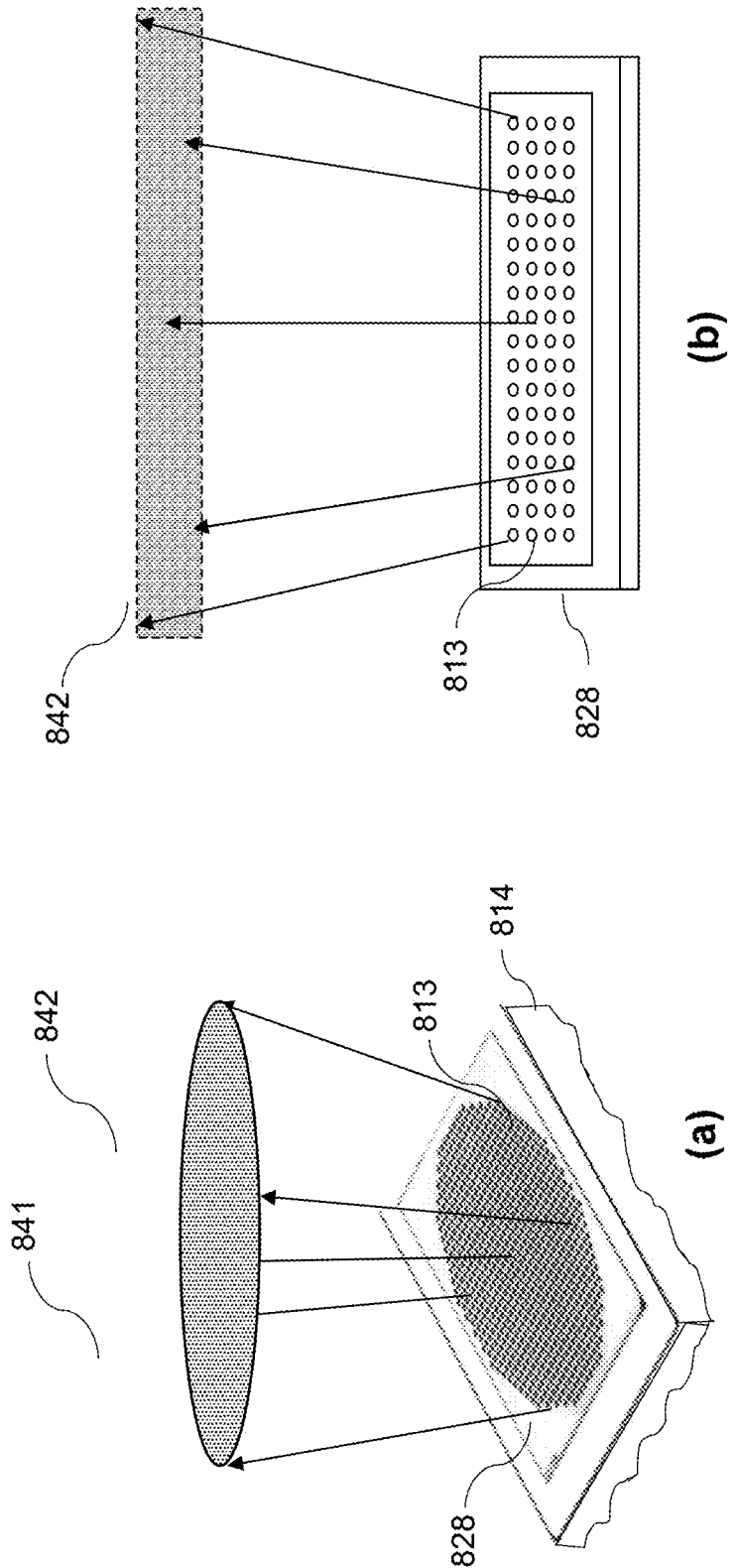
FIG. 8 is a schematic representation of generating structured light pattern using non-symmetrical microlens arrangement and progressive lateral displacement of microlens to achieve: a) an oval pattern and b) a line pattern.

The principles of the invention are equally applicable for non-symmetrical structured light patterns generation by appropriately selecting a microlens array and the lateral displacement (with respect to the central axis of the VCSEL array chip) necessary to obtain a desired deflection and tilt of the emission beams. One exemplary embodiment shown in FIG. 8 illustrates the use of a microlens array to generate a non-symmetrical emission pattern from a symmetrical VCSEL array chip similar to the one shown in FIGS. 7*a* and 7*b*. The VCSEL array chip is substantially similar to the one described in reference with FIG. 7. The microlens array 828 is configured such that the microlens arrays in one lateral direction is progressively displaced to deflect and tilt the emitted beams and direct the beams towards the central axis of the array chip. In the other lateral direction, the microlens arrays are progressively displaced in the opposite direction to deflect and tilt the beams 841 away from the central axis of the array chip. As a result, the structured light pattern 842 acquires an oval shape which is very different than the original shape of the VCSEL array chip.

A second example of generating a desired structured light pattern is illustrated in FIG. 8b. The array chip 813 in this example comprises a rectangular array configured with a microlens array 828. The lateral displacement of the microlens elements are selected appropriately, such that a line pattern 842 is generated. It should be noted that the microlens array may be configured by using different types of microlenses (symmetric, asymmetric having spherical or aspherical surfaces) in the same array. The lateral displacement is often pre-determined to generate desired structured light patterns. However, displacement and tilt could be dynamically arranged for advanced structured light illuminators.

It can be appreciated that applying the principles of this invention, the shape, size and resolution of the structured light patterns may easily be altered. A further dimension is added by the fact that the microstructure od the structure light pattern may be altered by variations in the shapes and sizes of current confining aperture of the VCSEL device as described in the parent application (No. 14,848791) of this application. Furthermore, for an addressable VCSEL array chip, the structured illumination pattern may also be dynamically generated selectively to image different regions at different pace, resolution and thereby allowing different imaging and analysis methods to be adapted in the same apparatus.

Figure 9:
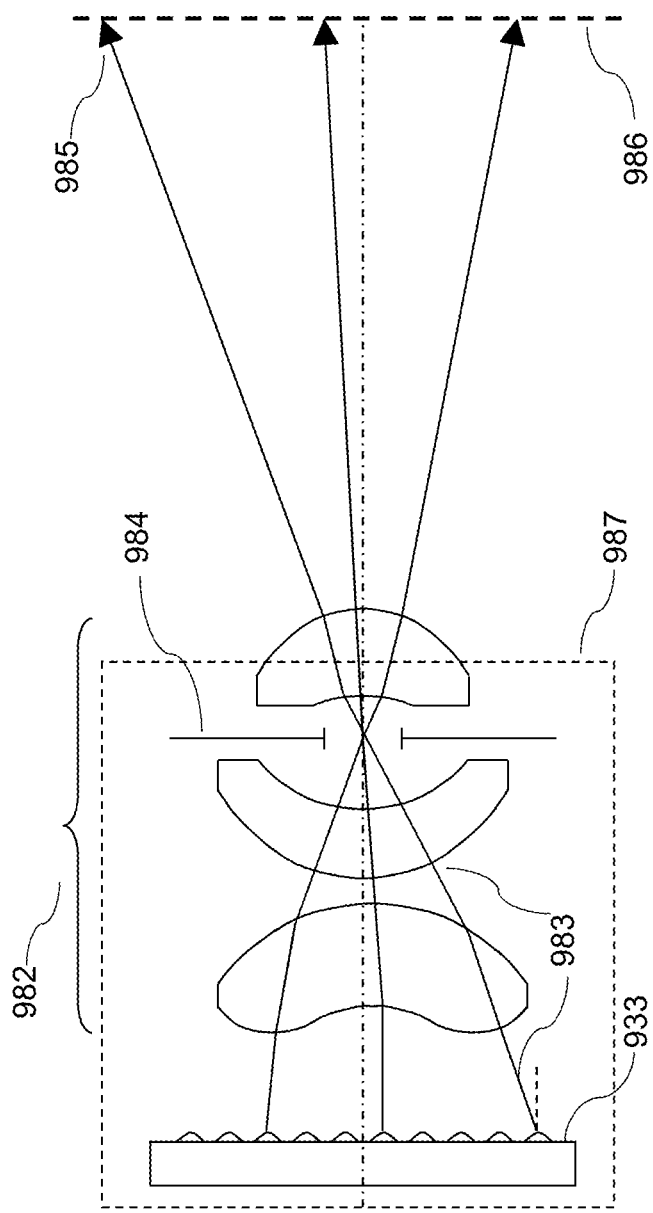
FIG. 9 is a schematic representation of an optical illuminator module including a structured light source and a low profile imaging/projection lens.

In one aspect of the invention the structured light illuminator is used as an optical sub-assembly for other devices or as a miniature structured light projector by combining with suitable projection optics for a stand-alone portable 3-D imaging, gesture recognition and other devices. The structured light projector modules as small as 6.5×6.5×3 mm$^3$ or smaller may be achieved using the principles of this invention. An exemplary embodiment shown in FIG. 9 schematically represents a miniature structured light projection module constructed according to the principles of this invention. A structured light illuminator comprising a surface emitting array (VCSEL or RC-LED) including a microlens array 933, is combined with a miniature projection lens 982 to configure the structured light projection module 987. In this example a small low profile compound lens is selected for projection (e.g. Largan model 9386A (http://www.largan-.com.tw/html/product/all-list.htm)). The structured light source configured with the microlens array tilt the emission beams 983 and guide through the aperture 984 of the compound lens 982. The structured light pattern (985) generated by the source is projected on a distant plane 986.

Figure 10:
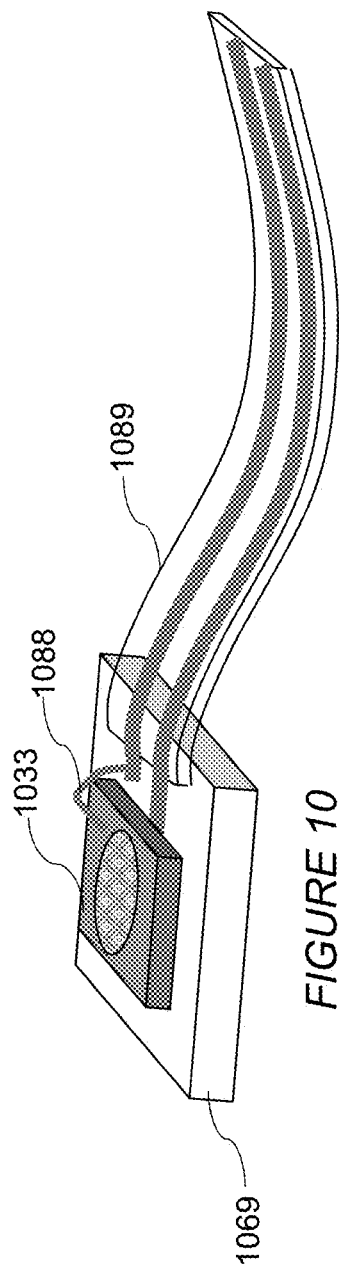
FIG. 10 is a schematic representation of a structured light illuminator configured as an optical sub-assembly using a flexible PCB.

Next, embodiments of the invention described earlier will be applied in constructing compact self-contained structured light illuminator/projector sub-assembly that may be included as an optical module for a 3-D imaging, gesture recognition and other handheld devices such as laptop computers, tablets and cell phones, etc. While an external microlens arrays on a different substrate may be bonded to the VCSEL array, for miniaturization, integrated microlens arrays are preferable. One embodiment of an optical sub-assembly is shown in FIG. 10. More specifically, a structured light illuminator 1033 comprising a surface emitting array and a microlens array described earlier, is the core of the optical sub-assembly. Structured light illuminator is bonded to a submount 1069, preferably a thermal submount, that may be bonded to, or placed in close physical contact with an external heat dissipation means if needed, for example in an application where the optical module is operated continuously. The submount also provides mechanical support and strength to the illuminator.

The submount includes electrical contact pads to which electrical terminals of the structured light illuminator are bonded. The top contact of the structured light illuminator is bonded, either by a wire bonding 1088 as shown in FIG. 10, or alternatively by surface bonding when the contact is available on the bottom surface of the illuminator. The second electrical terminal of the structured light illuminator located on the bottom surface is bonded to a corresponding bonding pad on the submount. In a preferred embodiment, both electrical terminals are located on the bottom surface of the illuminator for surface mounting. Electrical connection to the sub-assembly is provided using a flexible PCB 1089 bonded to the submount.

Figure 11:
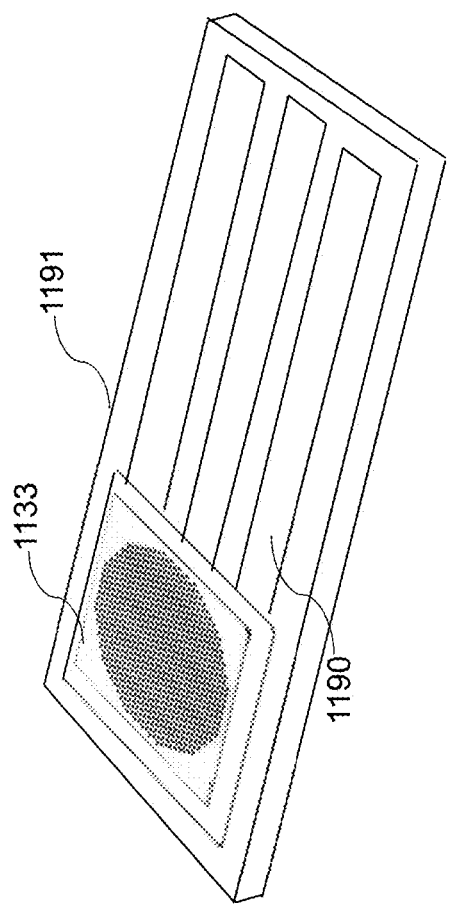
FIG. 11 is a schematic representation of a surface mounted structured light illuminator on a conventional rigid PCB.

In a variant embodiment shown in FIG. 11, the structured light illuminator 1133 is directly surface bonded to corresponding bonding pads (not visible in this view) on a PCB 1191, using a solder or by thermo compression bonding. The PCB include electrical tracks 1190 from the pads to provide electrical connections to the structured light illuminator for operation and control. The PCB may be a rigid or flexible one. This embodiment is more suitable for an optical module intended for low power application, or in an application where the optical module is operated intermittently.

Figure 12:
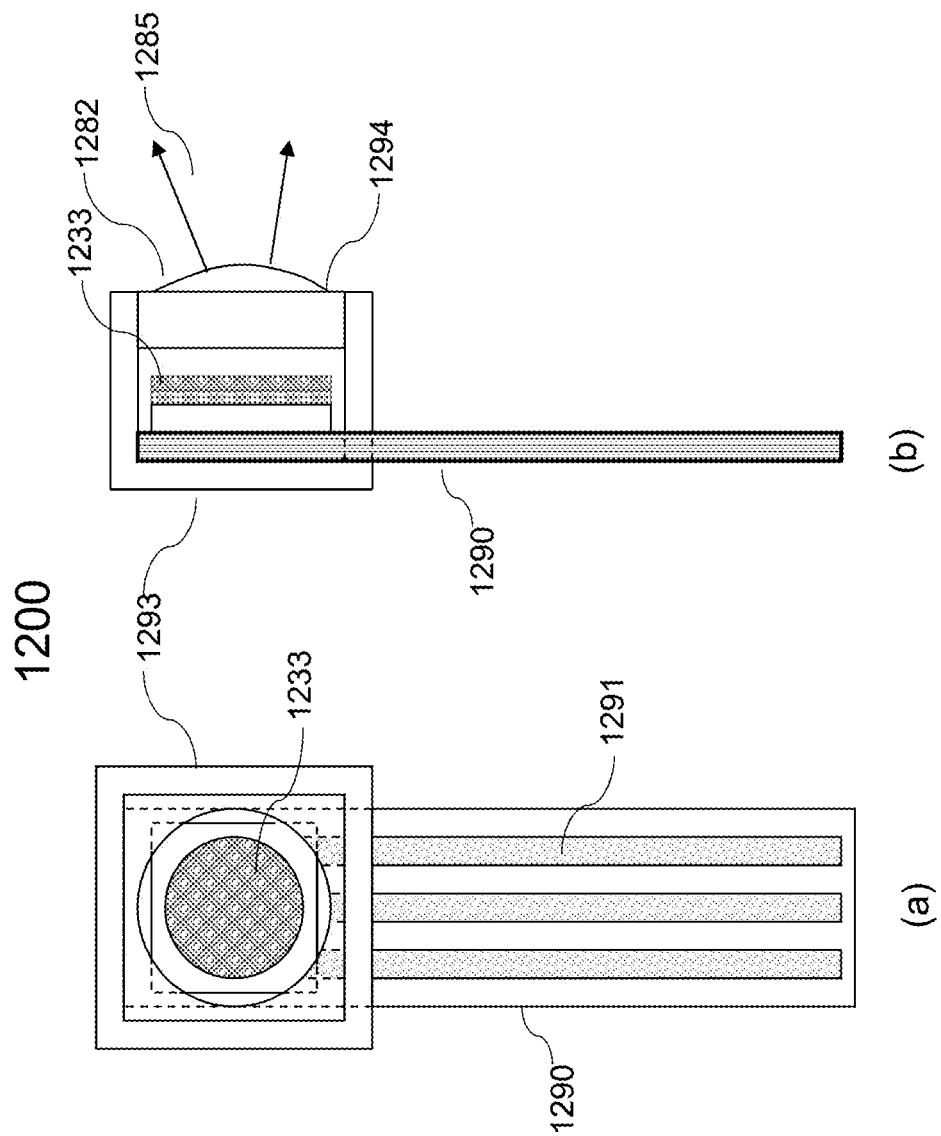
FIG. 12 is a schematic representation of a complete miniature structured light illuminator optical module bonded to a PCB, enclosed in a housing with an imaging/projection lens.

In yet another variant embodiment, an optical sub-assembly shown in FIG. 12 is configured with an imaging/projection lens. More specifically, the sub-assembly 1200 is similar to the one described in reference with FIG. 11. FIG. 12a shows a plan view and FIG. 12b shows a side view of the assembled optical module, respectively. In this optical module the structured light illuminator 1233 including a microlens array, is bonded to a PCB 1290 to provide electrical connections for operation and control. The structured light illuminator is assembled in housing 1293. A projection lens 1282 positioned in a lens holder 1294 (only visible in the side view in FIG. 12b) is aligned with the structured light illuminator to project the image 1285 of the structured light pattern generated by the illuminator. The projection lens may be a simple or a complex lens system as described in reference with FIG. 9. The optical module so assembled is still very compact to be incorporated in a handheld device.

Figure 13:
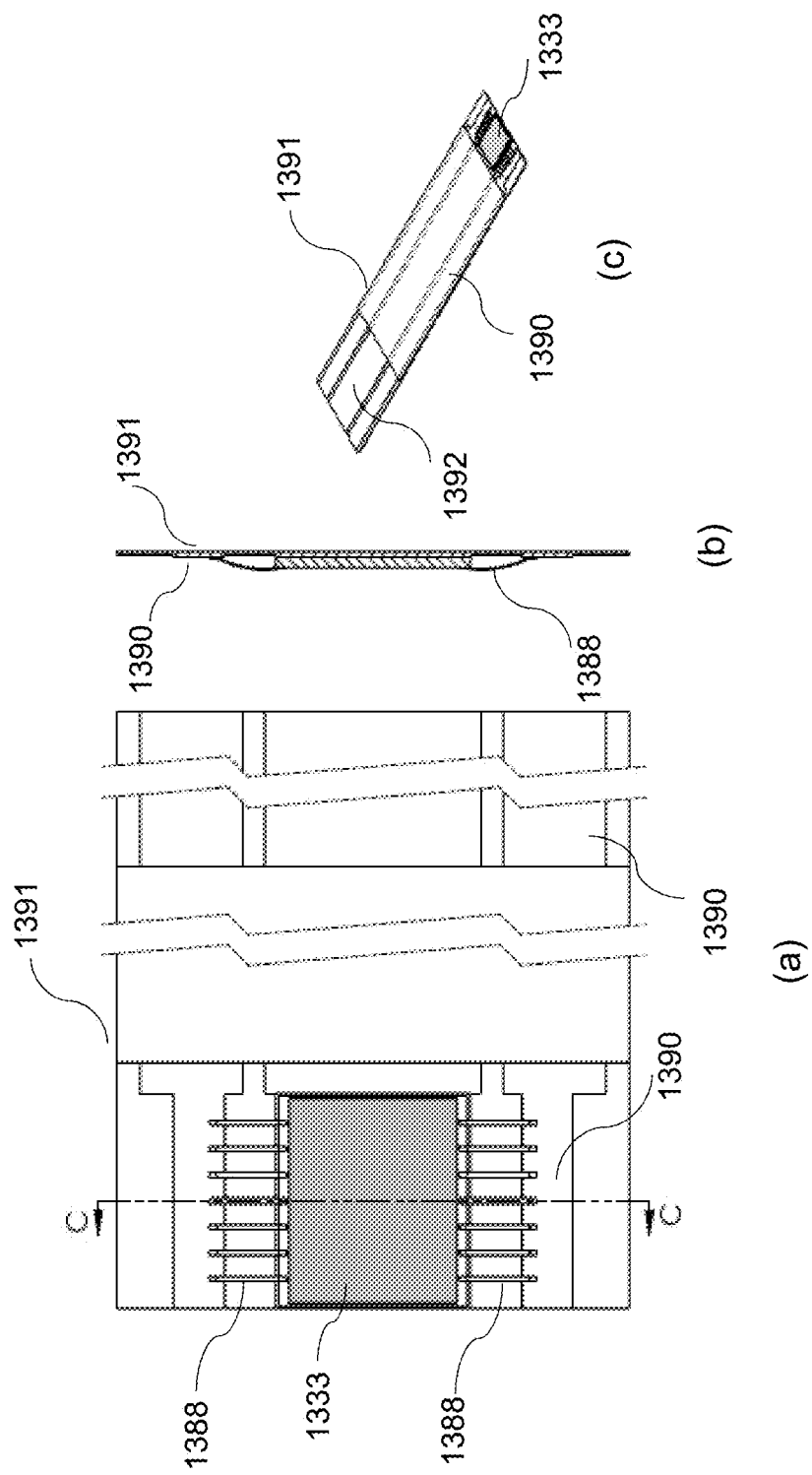
FIG. 13 is a Computer Aided Design (CAD) model mechanical drawing of a miniature structured light illumination module assembly on a PCB: a) expanded surface view, b) side view, and c) plan view.

FIG. 13 is a schematic representation of an optical module incorporating a structured light illuminator. More specifically, FIG. 13a represents a model mechanical CAD drawing of an actual sub-assembly, and FIGS. 13b and 13c respectively show side and a plan view of a finished device. Referring now to FIG. 13a, a VCSEL (or RC-LED) array with integrated microlens 1333 is bonded directly to a PCB 1391. The array is not a surface mounting one; therefore, top electrical contact of the VCSEL array is electrically connected to the PCB pad using a plurality of wire bonds 1388. Metal tracks 1390 on the PCB connect the VCSEL array to solder pads 1392 at the other end of the PCB.

Figure 14:
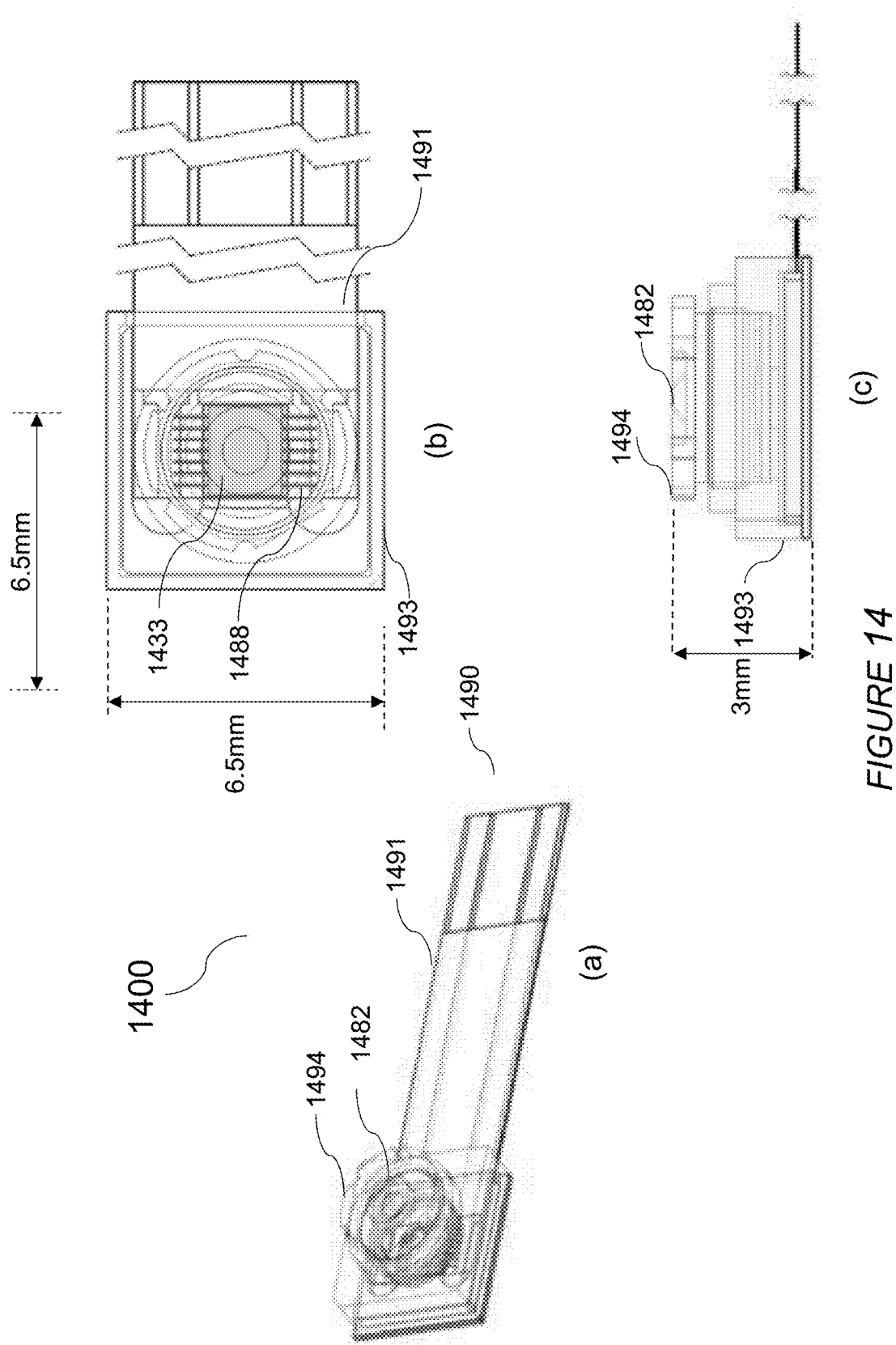
FIG. 14 is a model mechanical drawing showing physical design of a structured light illuminator optical module assembled on a flexible PCB: a) a plan view, b) expanded plan view and c) expanded side view of the optical assembly.

FIG. 14 is a schematic view of a model mechanical CAD drawing of a complete optical module including a structured light illuminator and a projection lens assembly. More specifically, FIGS. 14a, 14b and 14c, show a device package, a plan view of the module and a side view, respectively.

Different views are presented to show different aspects as some of the aspects are not visible in all the views. The structured light illuminator including the microlens array 1433 is substantially similar to the one described in reference to FIG. 13. The light source preferably a VCSEL (or RC-LED) array with integrated microlens array 1433 is bonded onto a flexible PCB 1490 with conducting tracks 1491 to provide electrical connection to the structured light illuminator. Electrical connection from the top of the VCSEL array chip are made to the pads on the PCB using wire bonding 1488. The sub-assembly is mounted in a housing 1493 with the flexible PCB 1490 extending out of the housing. A projection lens 1482 is assembled in a lens mount 1494 to align with the housing 1493 of the structured light source. The assembled optical module including the projection lens has a dimension of 6.5 mm×6.5 mm (shown in FIG. 14*b*) and the thickness of the module including the illuminator and the lens housing is about 3 mm. The output power depends on the number of devices and the mode of CW or pulsed operation and must comply with the laser safety standards of the industry. For example, in a high resolution structured light illuminator, there are about 500,000 VCSELs in 10 mm×10 mm size array chip (as disclosed in the parent application Ser. No. 14/848,791).

Figure 15:
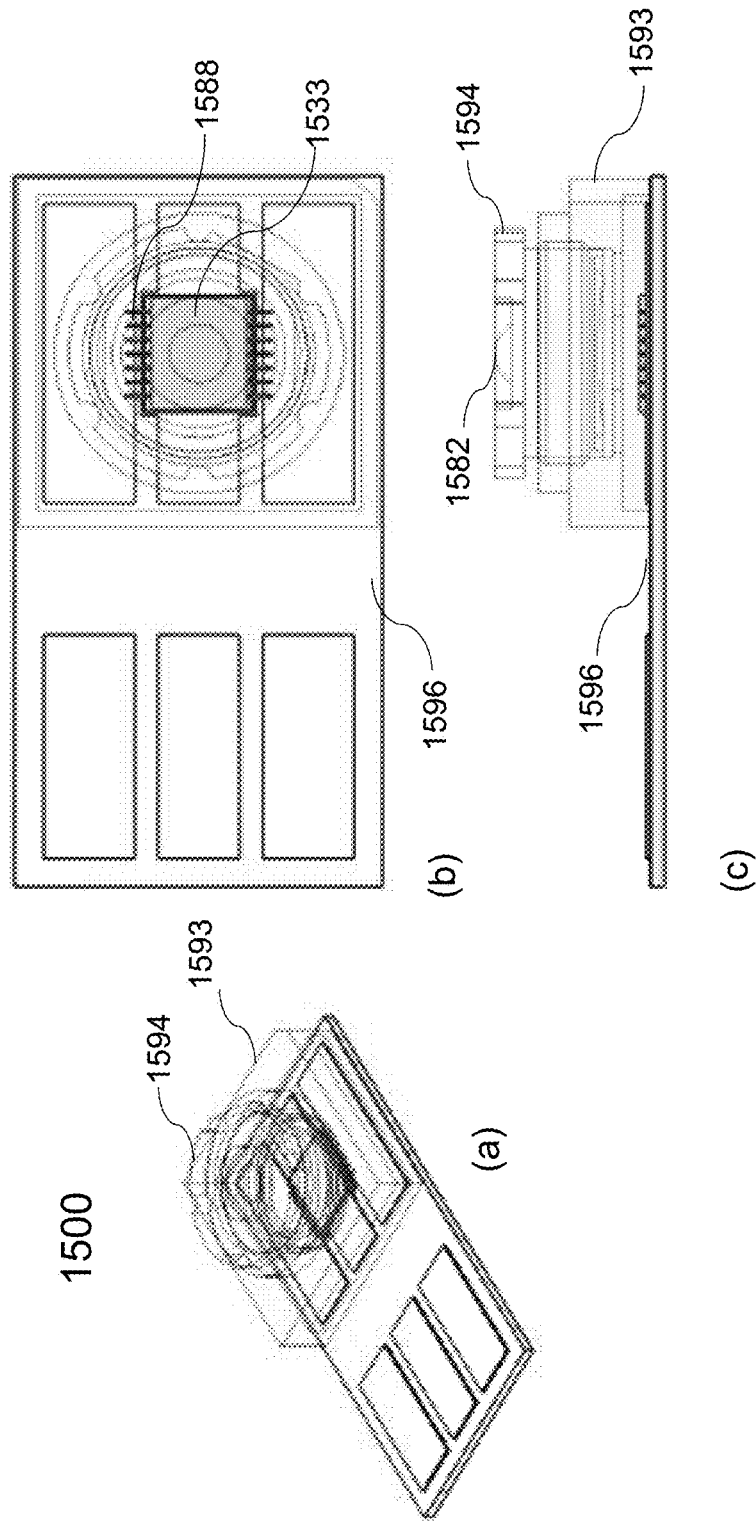
FIG. 15 is a model mechanical drawing of physical design of the structured light illuminator optical module assembled on a rigid PCB shown in FIG. 12: a) a plan view, b) expanded plan view of, and c) expanded side view.

In a variant embodiment shown in FIG. 15, a rigid PCB is used to assemble the optical module 1500. More specifically, FIG. 15*a* shows a model mechanical CAD drawing of a complete module whereas FIGS. 15*b* and 15*c* show expanded plan and side views of the module, respectively. The PCB 1596 is shorter but otherwise similar in function to the flexible PCB shown in FIG. 14. The surface emitting array with integrated microlens array 1533 is bonded to the PCB 1596 using wire bonds 1588 to connect the top contact of the surface emitting array to respective contact pads on the PCB. The housing 1593 is attached to the circuit board and the projection lens 1582 in its mount 1594 is aligned and secured to the housing.

Figure 16:
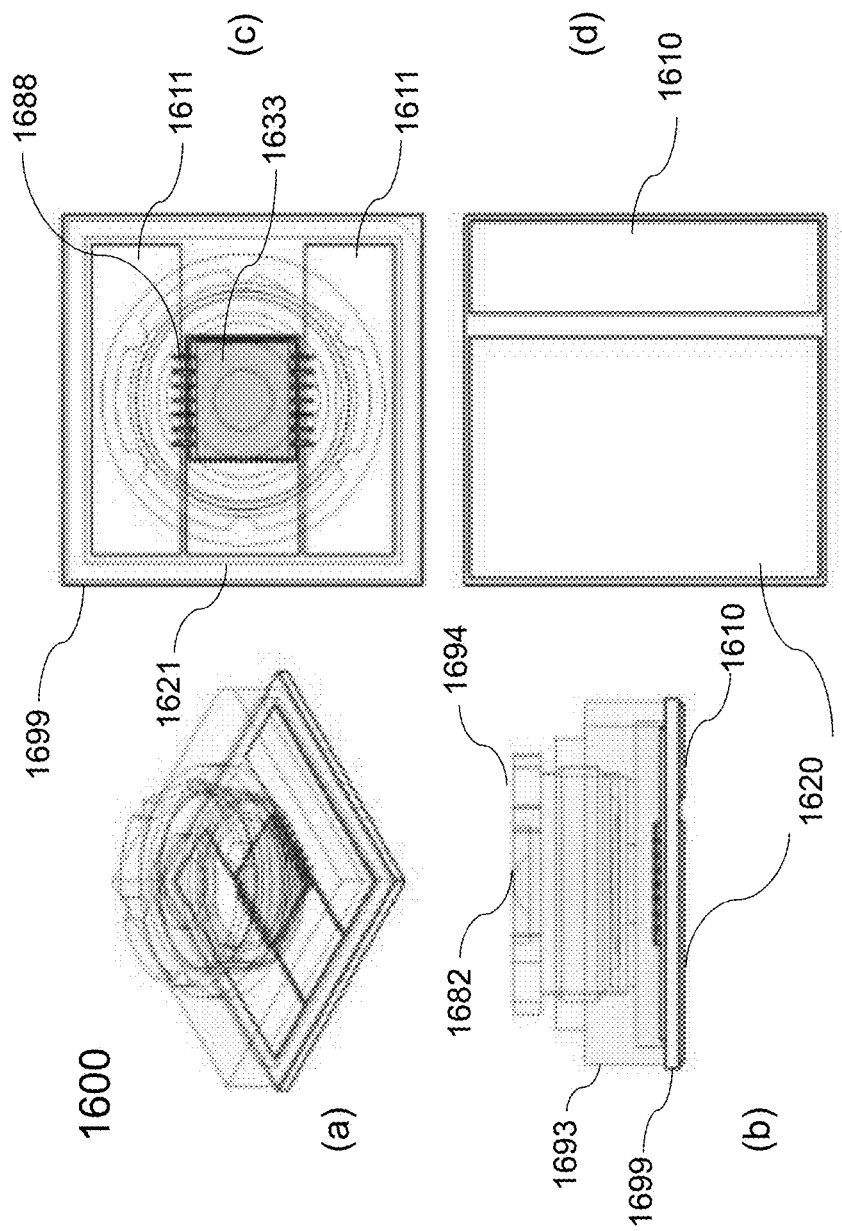
FIG. 16 is a model mechanical drawing of a surface mountable structured light illuminator optical module design: a) plan view, b) side view, c) expanded plan view and d) surface mounting contact pads placed on the bottom surface of the module.

In an alternative embodiment, a structured light illuminator optical module may be constructed using a surface mountable surface emitting array as shown in FIG. 16. A complete surface mountable module is shown in FIG. 16*a*, whereas FIGS. 16 *b*, 16*c* and 16*d* show a side, top and the bottom of the module, respectively to highlight different features of the packaged module. More specifically, FIG. 16*c* shows the structured light illuminator including the microlens array 1633, bonded to a submount or a PCB 1699. The surface of the submount 1699 to which the surface emitter array is bonded has contact pads 1611 that are in electrical contact with the solder pads 1610 and 1620 on the reverse side of the submount 1699 (FIGS. 16*b* and 16*d*). Electrical connections from the surface emitter array are made to the contact pads 1611 using wire bonding (1688). A housing 1693 is attached to the submount or PCB such that the bottom side is left exposed. The projection lens 1682 assembled in a lens mount 1694 is aligned and attached to the housing 1693. The complete surface mounted module 1600 may be bonded by soldering or thermo-compression by using the bottom contact pads (1610 and 1620) to a PCB that may also include the drive and control electronic Integrated Circuits (ICs) or an Application Specific Integrated Circuit (ASIC).

Figure 17:
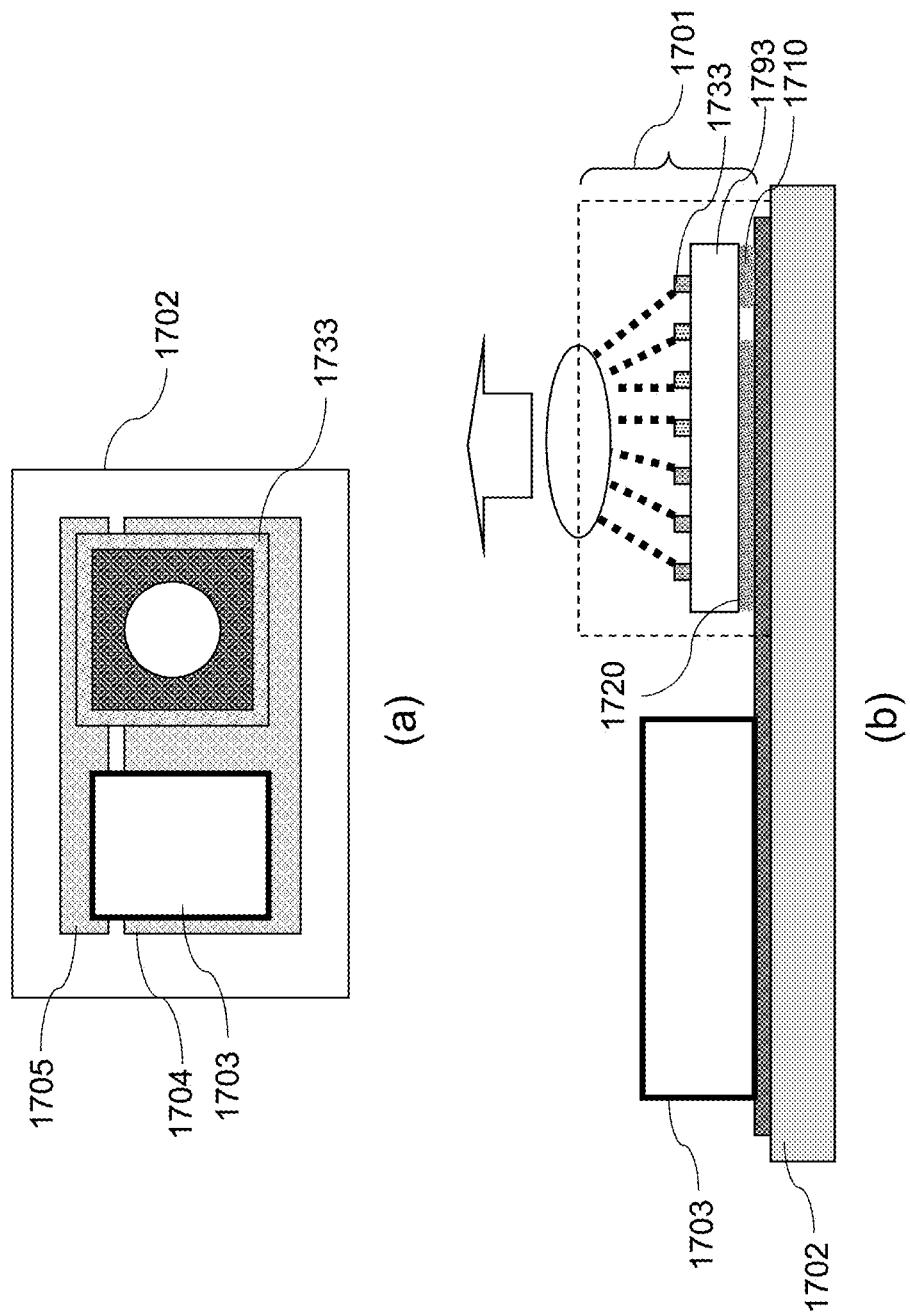
FIG. 17 is a schematic representation of a structured light illuminator optical module assembled with an electronic driver IC mounted on the common PCB to operate and control the optical module for stand-alone operation.

An embodiment of the structured light illuminator that incorporates integrated circuit control electronics and the surface emitting illuminator module is shown in FIG. 17. More specifically, FIGS. 17*a* and 17*b* show a plan view and a side view respectively. The structured light illuminator module 1701 comprising a surface emitting array with integrated microlens 2533, is surface mounted onto a PCB 1702 using the contact pads 1710 and 1720 located on the bottom side of the submount 1793. The PCB includes conductor traces 1704 and 1705 to connect one or more electronics circuit components collectively shown as 1703, to the surface emitting array 1701. The electronic components 1703 are assembled by surface mounting them adjacent to the surface emitting array. In an alternative embodiment, the optical module 1701 may further include a housing (not shown here) with an imaging/projection lens as shown in FIG. 16*a*. The electronic components may include photodetectors, CCD, sensors, control data processing and data storage devices necessary to configure a stand-alone handheld apparatus for 3D imaging or a gesture recognition, for example.

Principles of the invention may be applied to construct a wide range of very compact structured light illuminators, optical sub-assemblies and optical modules. Surface emitter devices may be constructed for multi-wavelength application, such as a RBG or white light source. The miniature structured light illuminator in surface mountable format is preferred for surface mounting with electronic components (on-board optics) to configure a complete handheld apparatus for various applications and for volume production, reliability and lower cost. These and other advantages of the principles disclosed here will be apparent to those skilled in the art.

Although a broad framework of the invention is described with reference to a few preferred embodiments, other embodiments may be configured by applying combinations and sub-combinations of elements described herein, depending on particular surface emitting structured illumination application. Variations and modifications of different embodiments that will be apparent to those skilled in the art are within the scope of the invention and are covered by appended claims.

What is claimed is:

1. A compact structured light optical module comprising:
    a structured light source including;
        an array of surface emitting light sources to generate one or more light beams in a pattern determined according to the array geometry and size, wherein said array of surface emitting light sources is one selected from a group consisting of a VCSEL array and a RC-LED array, and wherein the surface emitting light sources are configured with differently shaped current confinement apertures to generate light patterns having different shapes, so as to alter microstructure of the structured light illumination pattern by selectively superimposing said light patterns having different shapes;
        an array of microlenses integrated with the array of light sources, wherein a central axis of said one or more microlens is positioned to have a pre-determined lateral displacement with respect to a central axis of the corresponding one or more light beams, such that said each one or more microlens deflects corresponding said one or more light beams proportionally by a respective pre-determined angle along a different axis with respect to undeflected central axis of the one or more light beams to generate a structured light illumination pattern, and
        one or more optical elements for projecting the structured light illumination pattern at a distant plane.

2. The structured light optical module as in claim 1, wherein each one of said surface emitting light source has a gain region comprising more than one gain segment, each gain segment further including one or more quantum well, for higher output power and brightness.

3. The structured light optical module as in claim 1, wherein the VCSEL array comprises VCSEL devices that are one selected from the group consisting of two-reflector, integrated three-reflector and external three-reflector VCSEL devices.

4. A compact structured light optical module comprising:
a structured light source including;
    an array of surface emitting light sources to generate one or more light beams in a pattern determined according to the array geometry and size, wherein said array of surface emitting light sources is one selected from a group consisting of a VC SEL array and a RC-LED array;
    an array of microlenses integrated with the array of light sources,
    wherein a central axis of said one or more microlens is positioned to have a pre-determined lateral displacement with respect to a central axis of the corresponding one or more light beams to deflect corresponding said one or more light beams by a respective pre-determined angle, and
    wherein the direction and extent of said pre-determined lateral displacement of the each one or more microlens in the array is determined according to their respective position relative to the center of the array of surface emitting light sources, such that the deflection angle achieved for said one or more light beams changes progressively and proportionally along a different axis with respect to undeflected central axis of the one or more light beams to generate the structured light illumination pattern having a desired size and shape; and
    one or more optical elements for projecting the structured light illumination pattern at a distant plane.

5. The structured light optical module as in claim 4, wherein the number of microlenses is substantially the same as the number of surface emitting light sources, such that each microlens is registered with a corresponding one of the surface emitting light sources.

6. The structured light optical module as in claim 4, wherein the number of microlenses is smaller than the number of surface emitting light sources, such that each microlens is registered with a pre-determined group of surface emitting light sources.

7. The structured light optical module as in claim 4, wherein the number of microlenses is larger than the number of surface emitting light sources, such that total area of the array of microlenses is larger than the area of the array of the surface emitting light sources to capture all the light beams emitted.

8. The structured light optical module as in claim 4, wherein the direction and extent of said pre-determined lateral displacement of the each one or more microlens in the array is determined according to a respective pre-determined deflection angle to be achieved for said one or more light beams, for generating the structured light illumination pattern having a desired size and shape.

9. The structured light optical module as in claim 4, wherein the array of microlenses includes microlenses that are one selected from a group consisting of convex, concave, cylindrical, aspherical, and a combination thereof, to achieve a desired size and shape of the structured light illumination pattern.

10. The structured light optical module as in claim 9, wherein the curvature of the one or more microlenses determines the deflection angle of the one or more light beams.

11. The structured light optical module as in claim 9, wherein an asymmetry incorporated in the one or more microlenses imparts a tilt to the corresponding one or more light beams.

12. The structured light optical module as in claim 4, wherein the array of surface emitting light source and the array of microlenses are integrated monolithically or by bonding a pre-fabricated array of the one or more microlenses.

13. The structured light optical module as in claim 4 configured as a sub-assembly on a printed circuit board that is flexible or rigid, to provide electrical connection to the optical module.

14. The structured light optical module as in claim 4, wherein the structured light source is configured on a submount to facilitate surface mounting with electronic components on a common printed circuit board.

15. A method of generating a structured light illumination pattern, said method comprising the steps of:
    providing a structured light illumination source including an array of one or more VCSEL or RC-LED devices for generating one or more light beams in a pattern determined according to the array geometry and size, wherein said step of generating the structured light illumination pattern includes a further step of generating a desired microstructure effected through generating and superposing, differently shaped light patterns by configuring differently shaped current confinement apertures in VCSEL or RC-LED devices of said surface emitting light source;
    integrating the array of surface emitting light sources with an array of microlenses wherein said step of integrating includes a further step of positioning a central axis of said one or more microlens in the array to have a pre-determined lateral displacement with respect to a central axis of corresponding one or more light beams emitted from the array of surface emitting light sources for deflecting proportionally, said one or more light beams by a desired respective pre-determined angle along a different axis with respect to undeflected central axis of the one or more light beams, and
    generating a structured light illumination pattern of a desired shape, size and microstructure.

16. The method as in claim 15, wherein said step of integrating said array of surface emitting light sources is effected by constructing said array of microlenses monolithically or by bonding a pre-fabricated array of the one or more microlenses.

17. The method as in claim 15, wherein said step of deflecting said one or more light beams is effected through selecting a pre-determined lateral displacement of the each one or more microlens in the array according to their respective position relative to the center of the array of surface emitting light sources, thereby achieving the structured light illumination pattern having a desired size and shape.

18. The method as in claim 15, wherein said step of deflecting said one or more light beams is effected through selecting said one or more microlenses in the array, from a group consisting of convex, concave, cylindrical, aspherical, and a combination thereof, to achieve a desired size and shape of the structured light illumination pattern.

19. The method as in claim 18, wherein said step of deflecting said one or more light beams is effected through the curvature of the one or more microlenses in the array.

20. The method as in claim 18, wherein said step of deflecting said one or more light beams includes a further step of tilting by a desired angle effected through an asymmetry incorporated in the one or more microlenses in the array.

21. The method as in claim 15, wherein said step of generating the structured light illumination pattern includes a further step of projecting said structured light illumination pattern.

* * * * *